(12) United States Patent
Tada et al.

(10) Patent No.: US 7,727,640 B2
(45) Date of Patent: Jun. 1, 2010

(54) ORGANIC ELECTROLUMINESCENT ELEMENT

(75) Inventors: Hiroshi Tada, Kanagawa (JP); Hisashi Okada, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 672 days.

(21) Appl. No.: 11/315,324

(22) Filed: Dec. 23, 2005

(65) Prior Publication Data

US 2006/0141286 A1 Jun. 29, 2006

(30) Foreign Application Priority Data

Dec. 28, 2004 (JP) ............................. 2004-382033
Nov. 29, 2005 (JP) ............................. 2005-343785

(51) Int. Cl.
*H01L 51/54* (2006.01)
*C09K 11/06* (2006.01)

(52) U.S. Cl. ...................... 428/690; 428/917; 313/504; 313/506; 252/301.16; 257/40; 257/101

(58) Field of Classification Search ................ 428/212, 428/690, 917; 313/504, 506; 257/40, E51.044
See application file for complete search history.

(56) References Cited

U.S. PATENT DOCUMENTS

| | | | | |
|---|---|---|---|---|
| 6,730,929 B2 * | 5/2004 | Fukuyama et al. | ............ | 257/40 |
| 7,528,542 B2 * | 5/2009 | Kawamura et al. | .......... | 313/504 |
| 2001/0019782 A1 * | 9/2001 | Igarashi et al. | .............. | 428/690 |
| 2002/0028329 A1 * | 3/2002 | Ise et al. | ..................... | 428/336 |
| 2002/0074935 A1 * | 6/2002 | Kwong et al. | ............... | 313/504 |
| 2002/0086181 A1 * | 7/2002 | Lee-Mi et al. | .............. | 428/690 |
| 2002/0113545 A1 * | 8/2002 | Adachi et al. | ............... | 313/504 |
| 2002/0121860 A1 * | 9/2002 | Seo et al. | .................... | 313/506 |
| 2002/0182441 A1 * | 12/2002 | Lamansky et al. | .......... | 428/690 |
| 2004/0222739 A1 * | 11/2004 | Chen et al. | .................. | 313/504 |

FOREIGN PATENT DOCUMENTS

| | | |
|---|---|---|
| JP | 5-311161 A | 11/1993 |
| JP | 2001-237079 A | 8/2001 |
| JP | 2002-313583 A | 10/2002 |
| JP | 2004-79413 A | 3/2004 |
| JP | 2004-79414 A | 3/2004 |

* cited by examiner

*Primary Examiner*—D. Lawrence Tarazano
*Assistant Examiner*—Michael Wilson
(74) *Attorney, Agent, or Firm*—Birch, Stewart, Kolasch & Birch, LLP

(57) ABSTRACT

The present invention provides an organic electroluminescent element including, between an anode and a cathode, at least a luminescent layer and an adjacent layer that is adjacent to the cathode side of the luminescent layer, wherein the luminescent layer contains a phosphorescent material and a host material, the adjacent layer contains an electron transport material and a hole transport material, and the electron affinity Ea (HT) of the hole transport material and the electron affinity Ea (ET) of the electron transport material satisfy the relation of $1\text{ eV} \leqq \text{Ea (ET)} - \text{Ea (HT)} \leqq 2.8\text{ eV}$.

19 Claims, No Drawings

ORGANIC ELECTROLUMINESCENT ELEMENT

CROSS-REFERENCE TO RELATED APPLICATION

This application claims priority under 35 USC 119 from Japanese Patent Application Nos. 2004-382033 and 2005-343785, the disclosures of which are incorporated by reference herein.

BACKGROUND OF THE INVENTION

1. Field of the Invention

The present invention relates to an organic electroluminescent element capable of emitting light by converting electric energy into light (hereinafter also called organic EL element, luminescent element, or EL element).

2. Description of the Related Art

Various display elements are intensively researched and developed recently, and an organic electroluminescent (EL) element is noticed as a hopeful display element among others because light can be emitted at high luminance at low voltage.

The organic electroluminescent element is composed of counter electrodes having a luminescent layer or a plurality of organic layers including the luminescent layer therebetween, and makes use of luminescence from an exciton generated by rebonding of an electron injected from a cathode and a hole injected from an anode in the luminescent layer, or makes use of luminescence from an exciton of other molecule generated by energy transfer from the generated exciton.

It has been proposed to reduce power consumption or enhance driving durability by containing a hole trap compound in an electron transport layer (see, for example, Japanese Patent Application Laid-Open (JP-A) Nos. 2004-79413, 2004-79414, and 2002-313583).

It has been also proposed to enhance driving durability and low voltage driving by a method of forming a hole blocking layer containing plural types of electron transport materials between a luminescent layer and an electron transport layer, or by a method of containing an aromatic diamine compound in an electron transport layer (see, for example, JP-A Nos. 2001-237079 and 5-311161).

However, organic electroluminescent elements using phosphorescent materials as luminescent materials (phosphorescent elements) are low in durability particularly in blue and green luminescence, and improvement of durability thereof is demanded.

SUMMARY OF THE INVENTION

The present invention has been made in view of the above circumstances and provides an organic electroluminescent element which is improved in driving durability without lowering the luminescence property. That is, the invention provides an organic electroluminescent element comprising, between an anode and a cathode, at least a luminescent layer and an adjacent layer that is adjacent to the cathode side of the luminescent layer, wherein the luminescent layer contains a phosphorescent material and a host material, the adjacent layer contains an electron transport material and a hole transport material, and the electron affinity Ea (HT) of the hole transport material and the electron affinity Ea (ET) of the electron transport material satisfy the relation of 1 eV≦Ea (ET)−Ea (HT)≦2.8 eV.

DETAILED DESCRIPTION OF THE INVENTION

Organic Electroluminescent Element

The organic electroluminescent element of the invention (sometimes called organic EL element) is specifically described below.

The organic electroluminescent element of the invention is an organic electroluminescent element comprising, between an anode and a cathode, at least a luminescent layer and an adjacent layer that is adjacent to the cathode side of the luminescent layer, wherein the luminescent layer contains a phosphorescent material and a host material, the adjacent layer contains an electron transport material and a hole transport material, and the electron affinity Ea (HT) of the hole transport material and the electron affinity Ea (ET) of the electron transport material satisfy the relation of 1 eV≦Ea (ET)−Ea (HT)≦2.8 eV.

Having such configuration, the organic electroluminescent element of the invention brings about excellent effects on driving durability without lowering luminescence property (high external quantum efficiency).

The adjacent layer of the invention suppresses decomposition caused by injection of holes into phosphorescent material and electron transport material.

In order that electrons will not be injected into the hole transport material, the relation of 1 eV≦Ea (ET)−Ea (HT)≦2.8 eV is essential. If electrons are injected, the hole transport material may be decomposed.

In addition, it is preferred that the electron transport material and the hole transport material contained in the adjacent layer should not be contained in the luminescent layer. If the electron transport material and the hole transport material contained in the adjacent layer is contained in the luminescent layer, they may impede rebonding of holes and electrons in the host material, or may impede energy transfer from the host material excited by the rebonding to the phosphorescent material.

The value of electron affinity in the invention is determined by the value of band gap calculated from the absorption spectrum of a single layer film, and the separately measured value of ionization potential (Ip). The value of ionization potential is measured by using AC-1 (manufactured by Riken Keiki) at room temperature and in the atmosphere. The measuring principle of AC-1 is explained by Chihaya Adachi et al. in "Collection of work function data of organic thin films" (CMC Publishing, 2004).

In the case of material of which ionization potential exceeds 6.2 eV, the ionization potential is measured by UPS (vacuum ultraviolet photoelectron spectroscopy) method due to the problem of measuring range.

In the organic electroluminescent element of the invention, ionization potential Ip (HT) of the hole transport material and ionization potential Ip (ET) of the electron transport material in the adjacent layer are preferably in a relation of 1 eV≦Ip (ET)−Ip (HT)≦2.8 eV, from the viewpoint of enhancement of driving durability. By satisfying the relation of 1 eV≦Ip (ET)−Ip (HT)≦2.8 eV, injection of holes into the electron transport material is largely suppressed, and durability is enhanced.

Configuration of the organic electroluminescent element of the invention is described below.

The luminescent element of the invention comprises a cathode and an anode, and comprises at least a luminescent layer and an adjacent layer that is adjacent to the cathode side of the luminescent layer between the two electrodes. The cathode and anode are preferably formed on a substrate.

Other organic compound layer may be disposed between the luminescent layer and anode, and between the adjacent layer and cathode. Owing to the properties of the luminescent element, at least one of the anode and cathode is preferably transparent. Usually, the anode is transparent.

Mode of lamination in the organic electroluminescent element of the invention is preferably in a sequence of a hole transport layer, a luminescent layer, and an adjacent layer, which are laminated from the anode side. Further, a charge blocking layer or the like may be disposed between the hole transport layer and luminescent layer.

In the invention, the above-mentioned layers including the luminescent layer, which are disposed between the anode and cathode, may be collectively called "organic compound layers."

Next, detailed explanations will be given regarding the elements constituting the organic electroluminescent element of the invention.

<Substrate>

The substrate which can be used in the invention is preferably a substrate which does not scatter or attenuate the light emitted from the luminescent layer. Specific examples thereof include inorganic materials such as yttria-stabilized zirconia (YSZ), and glass; polyesters such as polyethylene terephthalate, polybutylene phthalate, and polyethylene naphthalate; and organic materials such as polystyrene, polycarbonate, polyethersulfone, polyallylate, polyimide, polycycloolefin, norbomene resins, and poly(chlorotrifluoroethylene).

For example, when glass is used for the substrate, it is preferable to use a non-alkali glass as the substrate material, in order to reduce the ions eluting from the glass. Also, when soda lime glass is used, it is preferable to use one having a barrier coat such as silica or the like. In the case of using organic materials, preferred are those having excellent heat resistance, dimensional stability, solvent resistance, electrical insulating property and processability.

The shape, structure, size and the like of the substrate are not particularly limited and can be selected appropriately in accordance with the intended use, purpose and the like of the luminescent element. In general, the substrate is preferably plate-shaped. The structure of the substrate may be either a monolayer structure or a laminated structure. Further, the substrate may be made of a single material or of two or more materials.

The substrate may be colorless and transparent, or colored and transparent, but in view of not scattering or attenuating the light emitted from the luminescent layer, a colorless and transparent substrate is preferred.

The substrate can be provided with a layer preventing moisture permeation (gas barrier layer) on the surface or the back surface.

As for the material for the layer preventing moisture permeation (gas barrier layer), inorganic substances such as silicon nitride, silicon oxide or the like are suitably used. The layer preventing moisture permeation (gas barrier layer) can be formed, for example, by high frequency sputtering or the like.

When a thermoplastic substrate is used, a hard coat layer, an undercoat layer or the like may be further provided, if necessary.

<Anode>

It would be usually sufficient for the anode as long as it has the function as an electrode supplying holes to the organic compound layers. There is no limitation on the shape, structure, size or the like, and the material can be appropriately selected from known electrode materials depending on the intended use and purpose of the luminescent element. As described above, the anode is typically furnished as a transparent anode.

As for the material for the anode, mention may be suitably made of, for example, metals, alloys, metal oxides, electroconductive compounds or mixtures thereof, and preferred is a material having a work function of 4.0 eV or greater. Specific examples of the anode material include electroconductive metal oxides such as tin oxide doped with antimony or fluorine (ATO, FTO), tin oxide, zinc oxide, indium oxide, indium tin oxide (ITO), and indium zinc oxide (IZO); metals such as gold, silver, chromium, and nickel; as well as mixture or laminates of such metals and electroconductive metal oxides; inorganic electroconductive materials such as copper iodide, and copper sulfate; organic electroconductive materials such as polyaniline, polythiophene, and polypyrrole; and laminates of these substances with ITO. Preferred among these is an electroconductive metal oxide, and particularly preferred is ITO in the aspects of productivity, high electroconductivity and transparency.

The anode can be formed on the substrate according to a method appropriately selected, in consideration of the suitability to the material constituting the anode, for example, from wet methods such as printing and coating, physical methods such as vacuum deposition, sputtering and ion plating, and chemical methods such as CVD and plasma CVD. For example, when ITO is selected as the material for anode, formation of the anode can be carried out by DC sputtering or high frequency sputtering, vacuum deposition, ion plating or the like.

In the organic electroluminescent element of the invention, the anode can be formed in any part of the luminescent element selected according to the intended use and purpose thereof, without particular limitation. It is preferred that the anode is formed on the substrate. In this case, the anode may be formed on the entire surface of one side of the substrate, or in a part of such surface.

Moreover, patterning in the formation of an anode may be carried out by means of chemical etching involving photolithography or the like, or by means of physical etching involving laser or the like. Further, it may be also carried out by vacuum deposition or sputtering with masking, or may be carried out by the lift-off method or printing method.

The thickness of the anode can be appropriately selected in accordance with the material constituting the anode and thus cannot be indiscriminately defined. It is usually from 10 nm to 50 μm, and preferably from 50 nm to 20 μm.

The resistance value of the anode is preferably $10^3 \Omega/\square$ or less, and more preferably $10^2 \Omega/\square$ or less. When the anode is transparent, it may be colorless and transparent, or colored and transparent. In order to obtain luminescence from the transparent anode side, the transmission is preferably 60% or higher, and more preferably 70% or higher.

In addition, a transparent anode is described in detail in "Tohmeidenkyokumaku No Shintenkai (New Development of Transparent Electrode Films)" supervised by Yutaka Sawada, CMC Inc. (1999), the description of which is applicable to the invention. In case of using a plastic substrate with low heat resistance, it is preferable to employ ITO or IZO and a transparent anode film formed at a low temperature of 150° C. or below.

<Cathode>

It is usually sufficient for a cathode as long as it has the function as an electrode injecting electrons to the organic compound layers. There is no limitation on the shape, structure, size or the like, and the material can be appropriately selected from known electrode materials depending on the intended use and purpose of the luminescent element.

As for the material constituting the cathode, mention may be suitably made of, for example, metals, alloys, metal oxides, electroconductive compounds or mixtures thereof, and preferred is a material having a work function of 4.5 eV or less. Specific examples of the cathode material include alkali metals (e.g., Li, Na, K, Cs, etc.), alkaline earth metals (e.g., Mg, Ca, etc.), gold, silver, lead, aluminum, sodium-potassium alloys, lithium-aluminum alloys, magnesium-silver alloys, indium, rare earth metals such as ytterbium. They may be used individually, or from the viewpoint of achieving both stability and electron injection property, they may be suitably used in combination of two or more types.

Among these, as for the material constituting the cathode, alkali metals or alkaline earth metals are preferred from the viewpoint of the electron injection property, and materials mainly comprising aluminum are preferred from the viewpoint of excellent storage stability.

The materials mainly comprising aluminum are, for example, aluminum itself, alloys comprising aluminum and 0.01 to 10% by mass of alkali metals or alkaline earth metals (e.g., lithium-aluminum alloys, magnesium-aluminum alloys, etc.), and mixtures thereof.

In addition, the materials for the cathode are described in detail in JP-A 2-15595 and JP-A 5-121172, the descriptions of which are applicable to the invention.

The method for formation of a cathode is not particularly limited and may be carried out according to a known method. The cathode can be formed according to a method appropriately selected, in consideration of the suitability to the material constituting the cathode, for example, from wet methods such as printing and coating, physical methods such as vacuum deposition, sputtering and ion plating, and chemical methods such as CVD and plasma CVD. For example, in the case of selecting a metal or the like as the material for the cathode, the formation can be carried out by simultaneous or successive sputtering of one, or two or more types thereof.

Patterning in the formation of the cathode may be carried out by means of chemical etching involving photolithography or the like, or by means of physical etching involving laser or the like. Further, it may be also carried out by vacuum deposition or sputtering with masking, or may be carried out by the lift-off method or printing method.

In the invention, there is no particular limitation on the location of the cathode formed, and the cathode may be formed all over the organic compound layer, or in a part thereon.

Further, a dielectric layer of 0.1 to 5 nm in thickness, comprising a fluoride, oxide or the like of an alkali metal or an alkaline earth metal may be inserted in between the cathode and the organic compound layer. This dielectric layer can be viewed as a type of electron injecting layer. The dielectric layer can be formed by, for example, vacuum deposition, sputtering, ion plating or the like.

The thickness of the cathode can be appropriately selected in accordance with the material constituting the cathode and thus cannot be indiscriminately defined. It is usually from 10 nm to 5 µm, and preferably from 50 nm to 1 µm. Also, the cathode may be transparent or opaque. In addition, a transparent cathode can be formed by forming a film of a cathode material having a thickness of 1 to 10 nm and further laminating thereon a transparent electroconductive material such as ITO or IZO.

The organic electroluminescent element of the invention has a luminescent layer, and an adjacent layer that is adjacent to the cathode side of the luminescent layer, but may also include other layers as mentioned above.

Examples of other layers include a hole transport layer, an electron transport layer, a charge blocking layer, a hole injecting layer, and an electron injecting layer.

Examples of the layer that is adjacent to the luminescent layer at the anode side thereof include a hole injecting layer, a hole transport layer, and an electron block layer, and in particular the hole transport layer is preferred. These layers are described specifically below.

—Formation of Organic Compound Layer—

In the organic electroluminescent element of the invention, each of the organic compound layers can be suitably formed by a dry film forming method such as vapor deposition or sputtering, a transcription method, a printing method and the like.

—Luminescent Layer—

The luminescent layer is a layer having the function of emitting light by accepting holes from the anode, the hole injecting layer or the hole transport layer and accepting electrons from the cathode, the electron injecting layer or the electron transport layer upon application of an electric field, and providing a site for recombination of the holes and the electrons.

The luminescent layer according to the invention contains a phosphorescent material (dopant) and a host material. The host material, which is not particularly limited, is preferably a charge transport material.

Further, one or more luminescent layers may be included, and each of the layers may emit light in different colors.

The phosphorescent material contained in the luminescent layer is in general a complex including a transition metal atom or a lanthanoid atom.

The transition metal atom is not particularly limited but may be preferably exemplified by ruthenium, rhodium, palladium, tungsten, rhenium, osmium, iridium and platinum, and more preferably by rhenium, iridium and platinum.

The lanthanoid atom may be exemplified by lanthanum, cerium, praseodymium, neodymium, samarium, europium, gadolinium, terbium, dysprosium, holmium, erbium, thulium, ytterbium and lutetium. Among these lanthanoid atoms, neodymium, europium and gadolinium are preferred.

As for the ligand of the complex, mention may be made of, for example, the ligands described in G. Wilkinson et al, Comprehensive Coordination Chemistry, Pergamon Press (1987); H. Yersin, "Photochemistry and Photophysics of Coordination Compounds," Springer-Verlag (1987); Akio Yamamoto, "Yukikinzokukagaku—Kiso to Oyo (Organometallic Chemistry—Fundamentals and Applications)," Shokabo (1982); and the like.

Specific examples of the ligand include preferably halogen ligands (preferably chlorine ligand), nitrogen-containing heterocyclic ligands (e.g., phenyl pyridine, benzoquinoline, quinolinol, bipyridyl, phenanthroline, etc.), diketone ligands (e.g., acetylacetone, etc.), carboxylic acid ligands (e.g., acetic acid ligand, etc.), carbon monoxide ligand, isonitrile ligand, and cyano ligand, and more preferably nitrogen-containing heterocyclic ligands. The complex may have one transition metal atom, and may be also a so-called multinuclear complex having two or more of such atoms. It may also contain metal atoms of different types simultaneously.

The phosphorescent material is contained in the luminescent layer in an amount of preferably from 0.1 to 20% by mass, and more preferably from 0.5 to 10% by mass.

The host material contained in the luminescent layer according to the invention is preferably a charge transport material as mentioned above, and may be exemplified by compounds having a carbazole skeleton, compounds having a diarylamine skeleton, compounds having a pyridine skeleton, compounds having a pyrazine skeleton, compounds having a triazine skeleton, and compounds having an arylsilane skeleton.

T1 level (the energy level of the lowest multiplet excited state) of the host material is preferably higher than the T1 level of the phosphorescent materials. By co-depositing the host material and the phosphorescent material, a luminescent layer in which the phosphorescent material is doped in the host material can be appropriately formed.

The thickness of the luminescent layer is not particularly limited, but usually it is preferably from 1 nm to 500 nm, more preferably from 5 nm to 200 nm, and even more preferably from 10 nm to 100 nm.

—Adjacent Layer—

The adjacent layer is formed adjacent to the cathode side of the luminescent layer in order to enhance driving durability.

The adjacent layer contains an electron transport material and a hole transport material. The difference (ΔEa) between the electron affinity Ea (ET) of the electron transport material and the electron affinity Ea (HT) of the hole transport material is 1 to 2.8 eV, that is, the materials satisfy the relation of 1 eV≦Ea (ET)−Ea (HT)≦2.8 eV.

Further, to enhance the driving durability, ΔEa is preferably 1.2 to 2.8 eV, more preferably 1.4 to 2.8 eV, and even more preferably 1.5 to 2.8 eV.

In addition, in order to enhance driving durability, ΔIp (Ip (ET)−Ip (HT)) is preferably 1.0 to 2.8 eV as mentioned above.

The number of the adjacent layer may be 1, or 2 or more.

In the invention, the electron transport material (preferably blocking material) used in the adjacent layer is not particularly limited as long as the electron affinity Ea (ET) of the electron transport material satisfy the relation of 1 eV≦Ea (ET)−Ea (HT)≦2.8 eV, and any preferred materials may be used.

Examples of the electron transport material include azoles (for example, oxazole, oxadiazole, imidazole, triazole, thiazole, thiadiazole, and their derivatives (including condensates)), azines (for example, pyridine, pyrimidine, triazine, and their derivatives (including condensates)), organic silanes (for example, silol, aryl substituted silane, and their derivatives (including condensates)), fluorine substituted aromatic hydrocarbon rings, various metal complexes such as a metal complex of 8-quinolinol, a metal phthalocyanine, and a metal complex having benzoxazole or benzothiazole as a ligand, and their derivatives.

The electron transport material used in the invention is preferably an azole compound or an azine compound, and more preferably is a compound represented by formula (A-1) or (B-1) below.

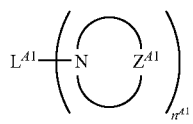

Formula (A-1)

In formula (A-1), $Z^{A1}$ represents an atomic group necessary for forming a nitrogen-containing heterocycle, $L^{A1}$ is a linking group, and $n^{A1}$ is an integer of 2 or more.

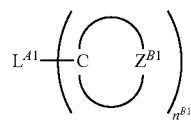

Formula (B-1)

In formula (B-1), $Z^{B1}$ represents an atomic group necessary for forming an aromatic hydrocarbon ring or an aromatic heterocycle, $L^{B1}$ is a linking group, and $n^{B1}$ is an integer of 2 or more.

The compound represented by formula (A-1) is explained.

In formula (A-1), $L^{A1}$ is a linking group. The linking group represented by $L^{A1}$ is preferably a linking group formed by a single bond, carbon, silicon, nitrogen, phosphorus, sulfur, oxygen, boron, germanium or the like, more preferably single bond, carbon atom, silicon atom, boron atom, oxygen atom, sulfur atom, germanium atom, aromatic hydrocarbon ring, and aromatic heterocycle, more preferably carbon atom, silicon atom, aromatic hydrocarbon ring, and aromatic heterocycle, more preferably divalent or higher aromatic hydrocarbon ring, divalent or higher aromatic heterocycle, and carbon atom, more preferably divalent or higher aromatic hydrocarbon ring and divalent or higher aromatic heterocycle, and particularly preferably 1,3,5-benzene triyl group, 1,2,5,6-benzene tetrayl group, 1,2,3,4,5,6-benzene hexayl group, 2,2'-dimethyl-4,4'-biphenylene group, 2,4,6-pyridine triyl group, 2,3,4,5,6-pyridine pentayl group, 2,4,6-pyrimidine triyl group, 2,4,6-triazine triyl group, and 2,3,4,5-thiophene tetrayl group.

Specific examples of the linking group represented by $L^{A1}$ include the following.

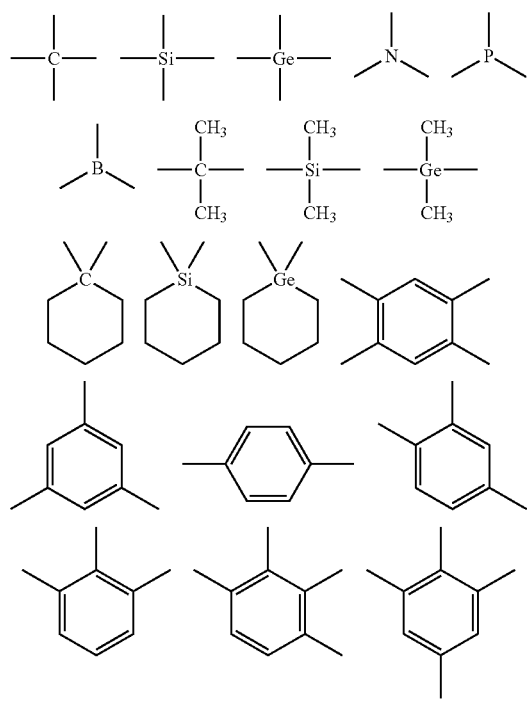

-continued
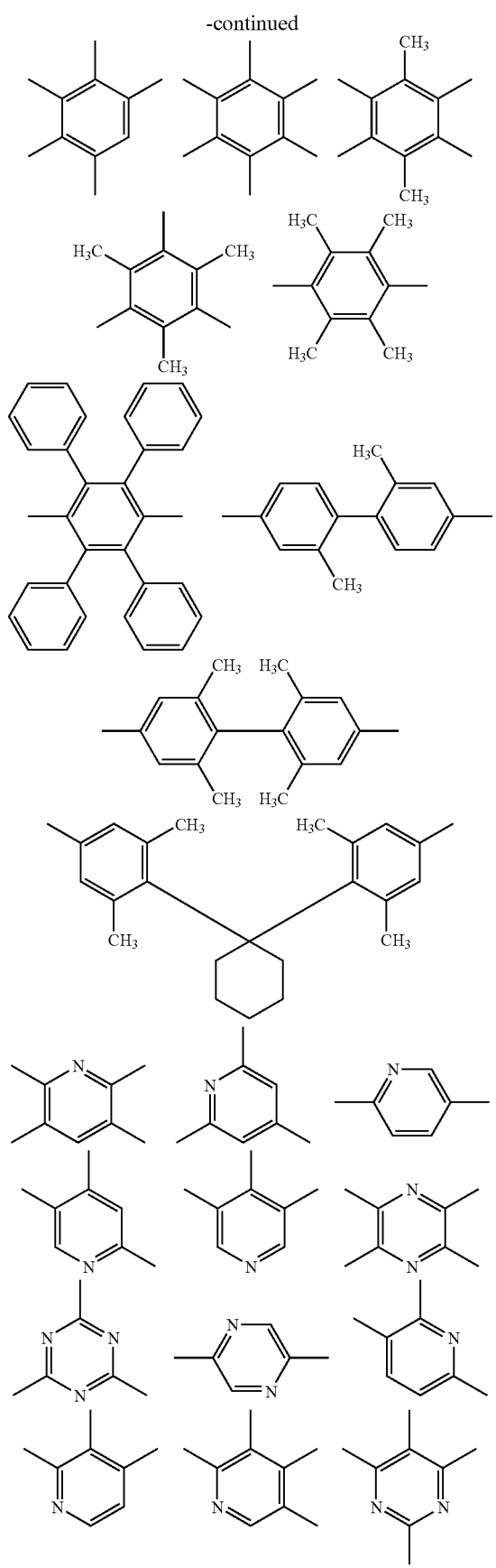
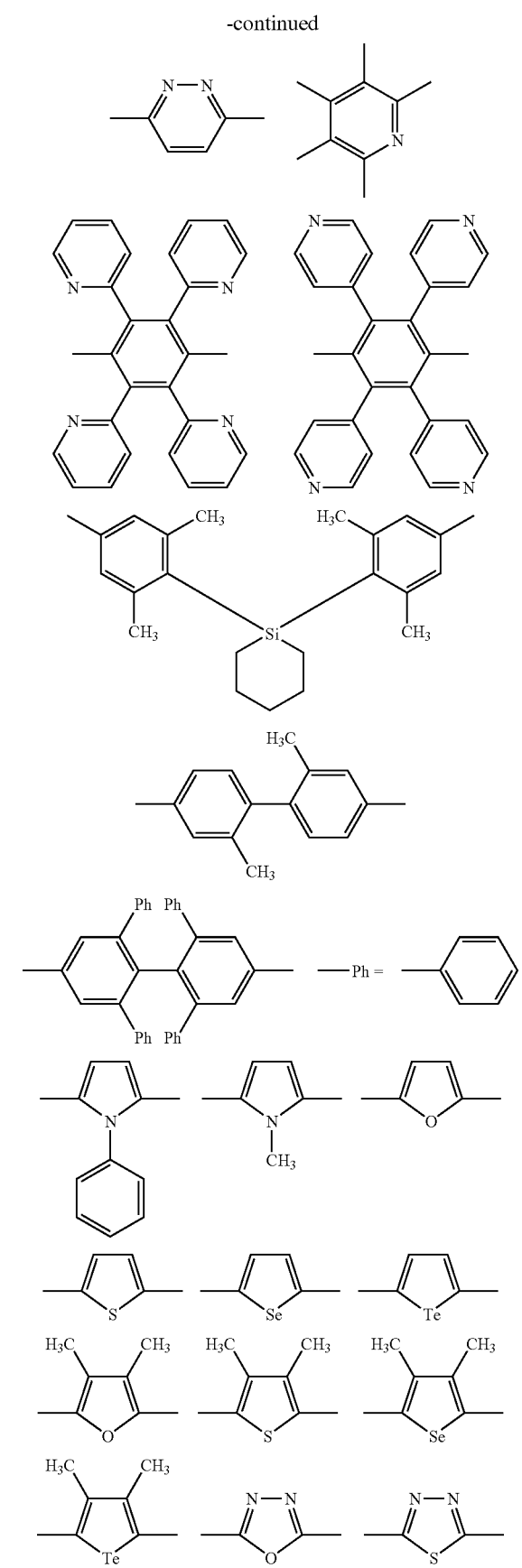

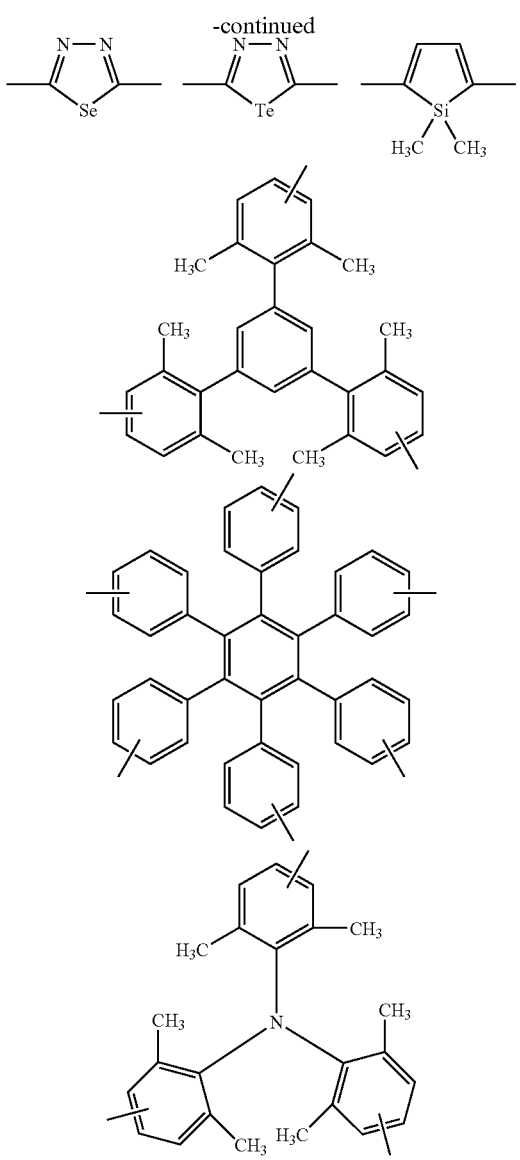

$L^{41}$ may also include a substituent, examples of the substituent include an alkyl group (preferably with 1 to 30 carbon atoms, more preferably 1 to 20 carbon atoms, most preferably 1 to 10 carbon atoms, for example, methyl, ethyl, iso-propyl, tert-butyl, n-octyl, n-decyl, n-hexadecyl, cyclopropyl, cyclopentyl, cyclohexyl), alkeny group (preferably 2 to 30 carbon atoms, more preferably 2 to 20 carbon atoms, most preferably 2 to 10 carbon atoms, for example, vinyl, allyl, 2-butenyl, 3-pentenyl), alkynyl group (preferably 2 to 30 carbon atoms, more preferably 2 to 20 carbon atoms, most preferably 2 to 10 carbon atoms, for example, propargyl, 3-pentynyl), aryl group (preferably 6 to 30 carbon atoms, more preferably 6 to 20 carbon atoms, most preferably 6 to 12 carbon atoms, for example, phenyl, p-methyl phenyl, naphthyl, anthranyl), amino group (preferably 0 to 30 carbon atoms, more preferably 0 to 20 carbon atoms, most preferably 0 to 10 carbon atoms, for example, amino, methyl amino, dimethyl amino, diethyl amino, dibenzyl amino, diphenyl amino, ditolyl amino), alkoxy group (preferably 1 to 30 carbon atoms, more preferably 1 to 20 carbon atoms, most preferably 1 to 10 carbon atoms, for example, methoxy, ethoxy, butoxy, 2-ethyl hexyloxy), aryl oxy group (preferably 6 to 30 carbon atoms, more preferably 6 to 20 carbon atoms, most preferably 6 to 12 carbon atoms, for example, phenyloxy, 1-naphthyloxy, 2-naphthyloxy), heterocycle oxy group (preferably 1 to 30 carbon atoms, more preferably 1 to 20 carbon atoms, most preferably 1 to 12 carbon atoms, for example, pyridyloxy, pyraldyloxy, pyrimidyloxy, quinolyloxy), acyl group (preferably 1 to 30 carbon atoms, more preferably 1 to 20 carbon atoms, most preferably 1 to 12 carbon atoms, for example, acetyl, benzoyl, formyl, pivaloyl), alkoxy carbonyl group (preferably 2 to 30 carbon atoms, more preferably 2 to 20 carbon atoms, most preferably 2 to 12 carbon atoms, for example, methoxy carbonyl, ethoxy carbonyl), aryloxy carbonyl group (preferably 7 to 30 carbon atoms, more preferably 7 to 20 carbon atoms, most preferably 7 to 12 carbon atoms, for example, phenyloxy carbonyl), acyloxy group (preferably 2 to 30 carbon atoms, more preferably 2 to 20 carbon atoms, most preferably 2 to 10 carbon atoms, for example, acetoxy, benzoyloxy), acylamino group (preferably 2 to 30 carbon atoms, more preferably 2 to 20 carbon atoms, most preferably 2 to 10 carbon atoms, for example, acetylamino, benzoylamino), alkoxy carbonyl amino group (preferably 2 to 30 carbon atoms, more preferably 2 to 20 carbon atoms, most preferably 2 to 12 carbon atoms, for example, methoxy carbonyl amino), aryloxy carbonyl amino group (preferably 7 to 30 carbon atoms, more preferably 7 to 20 carbon atoms, most preferably 7 to 12 carbon atoms, for example, phenyloxy carbonyl amino), sulfonyl amino group (preferably 1 to 30 carbon atoms, more preferably 1 to 20 carbon atoms, most preferably 1 to 12 carbon atoms, for example, methane sulfonyl amino, benzene sulfonyl amino), sufamoyl group (preferably 0 to 30 carbon atoms, more preferably 0 to 20 carbon atoms, most preferably 0 to 12 carbon atoms, for example, sulfamoyl, methyl sulfamoyl, dimethyl sufamoyl, phenyl sulfamoyl), carbamoyl group (preferably 1 to 30 carbon atoms, more preferably 1 to 20 carbon atoms, most preferably 1 to 12 carbon atoms, for example, carbamoyl, methyl carbamoyl, diethyl carbamoyl, phenyl carbamoyl), alkylthio group (preferably 1 to 30 carbon atoms, more preferably 1 to 20 carbon atoms, most preferably 1 to 12 carbon atoms, for example, methyl thio, ethyl thio), arylthio group (preferably 6 to 30 carbon atoms, more preferably 6 to 20 carbon atoms, most preferably 6 to 12 carbon atoms, for example, phenyl thio), heterocycle thio group (preferably 1 to 30 carbon atoms, more preferably 1 to 20 carbon atoms, most preferably 1 to 12 carbon atoms, for example, pyridyl thio, 2-benzimisolyl thio, 2-benzoxazolyl thio, 2-benzthiazolyl thio), sulfonyl group (preferably 1 to 30 carbon atoms, more preferably 1 to 20 carbon atoms, most preferably 1 to 12 carbon atoms, for example, mesyl, tosyl), sulfinyl group (preferably 1 to 30 carbon atoms, more preferably 1 to 20 carbon atoms, most preferably 1 to 12 carbon atoms, for example methane sulfinyl, benzene sulfinyl), ureide group (preferably 1 to 30 carbon atoms, more preferably 1 to 20 carbon atoms, most preferably 1 to 12 carbon atoms, for example, ureide, methyl ureide, phenyl ureide), amide phosphate group (preferably 1 to 30 carbon atoms, more preferably 1 to 20 carbon atoms, most preferably 1 to 12 carbon atoms, for example, amide diethyl phosphate, amide phenyl phosphate), hydroxy group, mercapto group, halogen atom (for example, fluorine atom, chlorine atom, bromine atom, iodine atom), cyano group, sulfo group, carboxyl group, nitro group, hydroxamic group, sulfino group, hydrozino group, imino group, heterocycle group (preferably 1 to 30 carbon atoms, more preferably 1 to 12 carbon atoms, for example, hetero atom including nitrogen atom, oxygen atom, sulfur atom, etc., and specifically imidazolyl, pyridyl, quinolyl, furyl, thienyl, piperidyl, morpholino, benzoxazolyl, benzimidazolyl, benzthiazolyl, carbazolyl group, and azepinyl), silyl group (preferably 3 to 40 carbon atoms, more preferably 3 to 30 carbon atoms, most preferably 3 to 24 carbon atoms, for example, trimethyl silyl, triphenyl silyl), silyl oxy group (preferably 3 to 40 carbon atoms, more preferably 3 to 30 carbon atoms, most preferably 3 to 24 carbon atoms, for example, trimethyl silyloxy, triphenyl silyloxy). These substituents may be further substituted. Substituents are preferably alkyl group, aryl group, heterocycle group, halogen atom, and silyl group, more preferably alkyl group, aryl group, heterocycle group, and halogen group, and most preferably alkyl group, aryl group, aromatic heterocycle group, and fluorine atom.

$Z^{A1}$ represents an atomic group necessary for forming a nitrogen-containing heterocycle, and the nitrogen-containing heterocycle including $Z^{A1}$ may be either a single ring or condensed ring condensing two or more rings. The nitrogen-containing heterocycle including $Z^{A1}$ is preferably a nitrogen-containing heterocycle of 5 to 8 members, more preferably nitrogen-containing heterocycle of 5 to 7 members, still more preferably aromatic nitrogen-containing heterocycle of 5 or 6 members, and particularly preferably aromatic nitrogen-containing heterocycle of 5 members. Plural nitrogen-containing heterocycles including $Z^{A1}$ connected to $L^{A1}$ may be either same or different.

Specific examples of the nitrogen-containing heterocycle including $Z^{A1}$ include a pyrrole ring, indole ring, oxazole ring, oxadiazole ring, thiazole ring, thiazaizole ring, aza indole ring, carbazole ring, carboline ring (Norharmann ring), imidazole ring, benzoimidazole ring, imidazopyridine ring, purin ring, pyrazole ring, indazole ring, aza indazole ring, triazole ring, tetrazole ring, azepine ring, iminostilbene ring (dibenzoazepine ring), tribenzoazepine ring, phenothiazine ring, and phenoxazine ring, preferably oxadiazole ring, triazole ring, imidazole ring, benzoimidazole ring, and imidazopyridine ring, and more preferably benzoimidazole ring and imidazopyridine ring.

If possible, $Z^{A1}$ may further form a condensed ring together with other ring, and may possess a substituent. The substituent of $Z^{A1}$ may be, for example, same as the example of the substituent of $L^{A1}$ in formula (A-1) listed above, and the preferred range is also the same.

$n^{A1}$ is an integer of 2 or more, preferably 2 to 8, and more preferably 2 to 6.

The compound represented by formula (B-1) is explained.

In formula (B-1), $L^{B1}$ is a linking group. Examples of the linking group $L^{B1}$ include the specific examples of the linking group $L^{A1}$ in formula (A-1) listed above, and preferred examples of $L^{B1}$ include a single bond, divalent or higher aromatic hydrocarbon ring, divalent or higher aromatic heterocycle, carbon atom, nitrogen atom, and silicon atom, more preferably divalent or higher aromatic hydrocarbon ring and divalent or higher aromatic heterocycle, and further preferably 1,3,5-benzene triyl group, 1,2,5,6-benzene tetrayl group, 1,2,3,4,5,6-benzene hexayl group, 2,2'-dimethyl-4,4'-biphenylene group, 2,4,6-pyridine triyl group, 2,3,4,5,6-pyridine pentayl group, 2,4,6-pyrimidine triyl group, 2,4,6-triazine triyl group, 2,3,4,5-thiophene tetrayl group, carbon atom, nitrogen atom, and silicon atom.

$L^{B1}$ may further possess a substituent, and the substituent may be, for example, same as the example of the substituent of $L^{A1}$ in formula (A-1) listed above, and the preferred range is also the same.

$Z^{B1}$ represents an atomic group necessary for forming an aromatic hydrocarbon ring or aromatic heterocycle, and the aromatic hydrocarbon ring or aromatic heterocycle containing $Z^{B1}$ may be either a single ring or condensed ring condensing two or more rings. A plurality of the aromatic hydrocarbon rings or aromatic heterocycles including $Z^{B1}$ connected to $L^{B1}$ may be either same or different.

The aromatic hydrocarbon ring containing $Z^{B1}$ has preferably 6 to 30 carbon atoms, more preferably 6 to 20 carbon atoms, and most preferably 6 to 12 carbon atoms, and preferred examples include a benzene ring, naphthalene ring, anthracene ring, phenanthrene ring, pyrene ring, and triphenylene ring, and preferably benzene ring, naphthalene ring, phenanthrene ring, and triphenylene ring.

The aromatic heterocycle containing $Z^{B1}$ is a heterocycle of single ring or condensed ring condensing two or more rings, and is an aromatic heterocycle having preferably 1 to 20 carbon atoms, more preferably 2 to 12 carbon atoms, and most preferably 2 to 10 carbon atoms. The heterocycle is preferably an aromatic heterocycle having at least one of nitrogen atom, oxygen atom, and sulfur atom. Specific examples of the heterocycle represented by $Z^{B1}$ include a pyridine ring, quinoline ring, isoquinoline ring, acridine ring, phenanthridine ring, puteridine ring, pyradine ring, quinosaline ring, pyrimidine ring, quinazoline ring, pyridadine ring, sinnoline ring, phthaladine ring, triazine ring, oxazole ring, benzoxazole ring, thiazole ring, benzothiazole ring, imidazole ring, benzimidazole ring, pyrazole ring, indazole ring, isoxazole ring, benzoisoxazole ring, isothiazole ring, benzisothiazole ring, oxadiazole ring, thiadiazole ring, triazole ring, tetrazole ring, furan ring, benzofuran ring, thiophene ring, benzothiophene ring, pyrrole ring, indole ring, imidazopyridine ring, carbazole ring, and phenanthroline ring, preferably pyridine ring, quinoline ring, isoquinoline ring, acridine ring, phenanthridine ring, pyradine ring, quinoxaline ring, pyrimidine ring, quinazoline ring, pyridazine ring, phthaladine ring, triazine ring, imidazole ring, benzimidazole ring, pyrazole ring, indazole ring, oxadiazole ring, triazole ring, imidazopyridine ring, carbazole ring, and phenanthroline ring, more preferably pyridine ring, quinoline ring, isoquinoline ring, pyradine ring, quinoxaline ring, pyrimidine ring, quinazoline ring, pyridazine ring, phthaladine ring, triazine ring, imidazole ring, benzimidazole ring, oxadiazole ring, triazole ring, imidazopyridine ring, and phenanthroline ring, still more preferably benzimidazole ring, oxadiazole ring, triazole ring, imidazopyridine ring, and phenanthroline ring, and particularly preferably benzimidazole ring and imidazopyridine ring.

The aromatic hydrocarbon ring or aromatic heterocycle containing $Z^{B1}$ may further form a condensed ring together with other ring, and may possess a substituent. The substituent may be, for example, same as the example of the substituent of $L^{A1}$ in formula (A-1) listed above, and the preferred range is also the same.

$n^{B1}$ is an integer of 2 or more, preferably 2 to 8, and more preferably 2 to 6.

The compound represented by formula (A-1) or formula (B-1) of the invention may be a low molecular compound, or may be an oligomer compound or polymer compound (weight-average molecular weight (as polystyrene) is preferably 1000 to 5000000, more preferably 2000 to 1000000, and still more preferably 3000 to 1000000). The compound of the invention is preferably a low molecular compound.

Specific examples of the compound represented by formula (A-1) or formula (B-1) of the invention are given below, but the invention is not limited to these compounds alone.

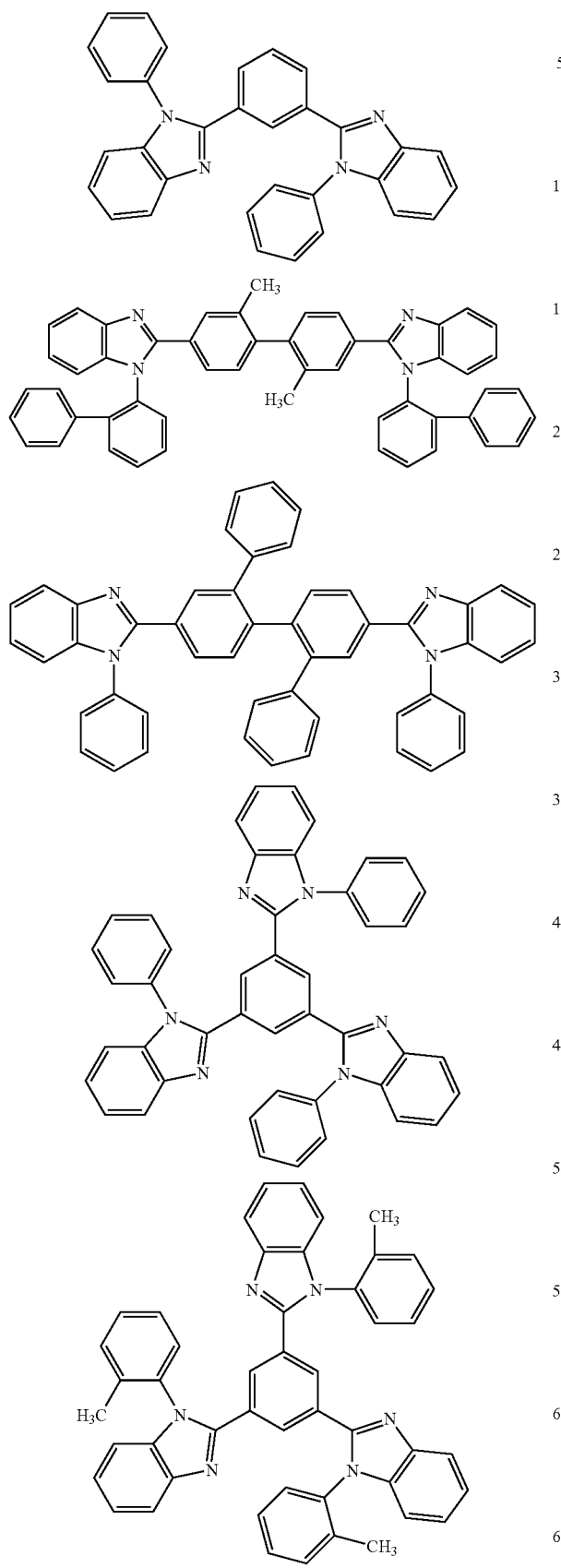
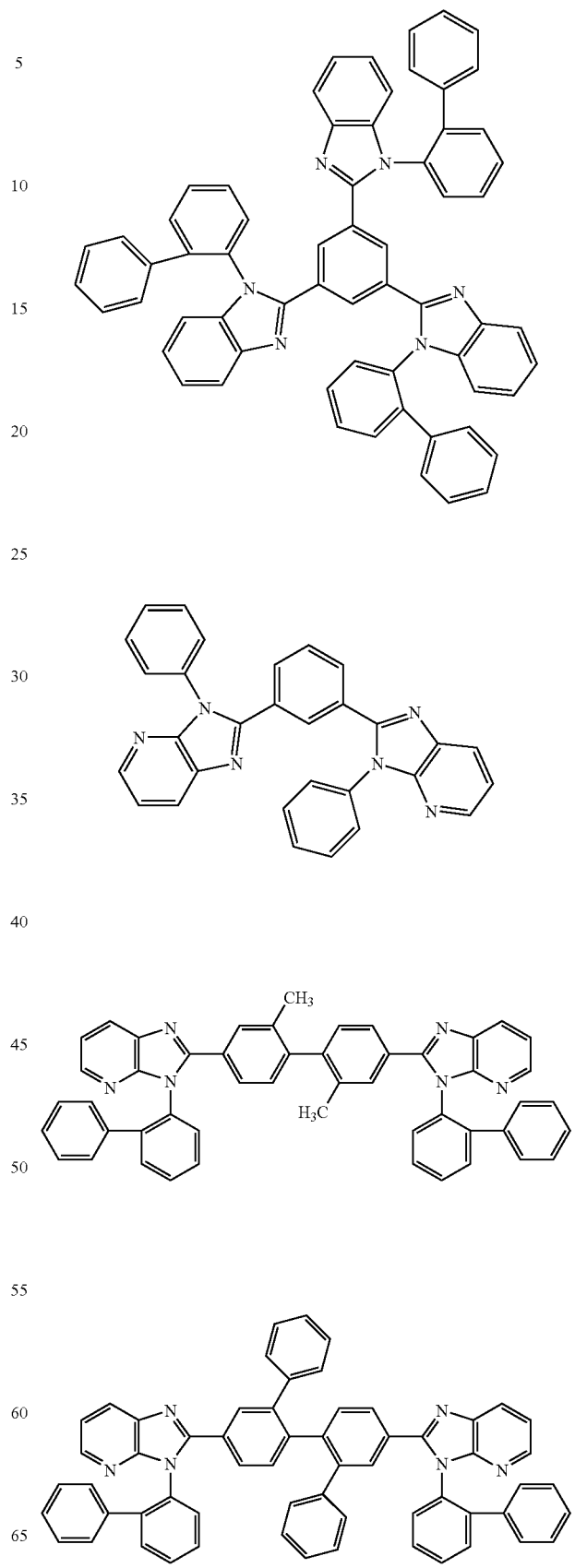

-continued
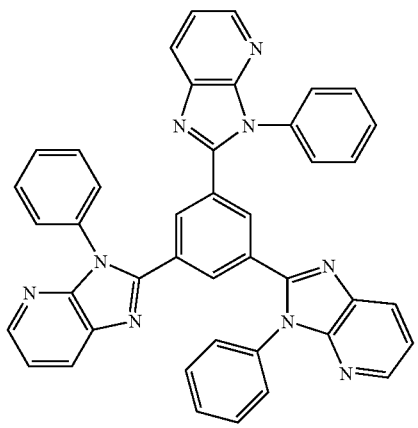
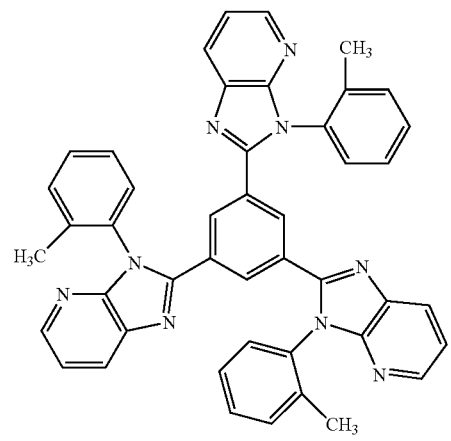
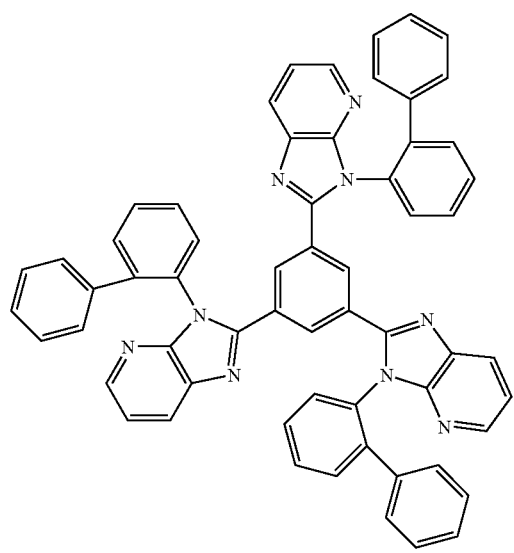
-continued
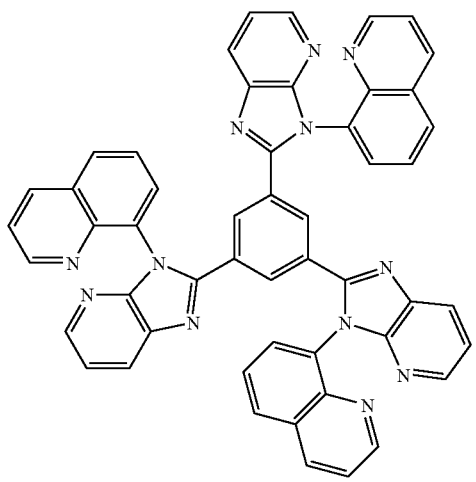
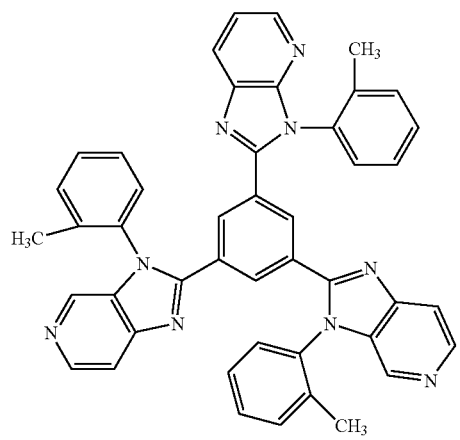
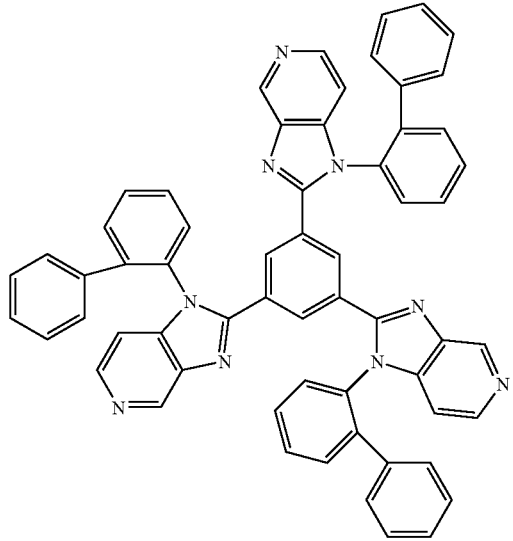

-continued
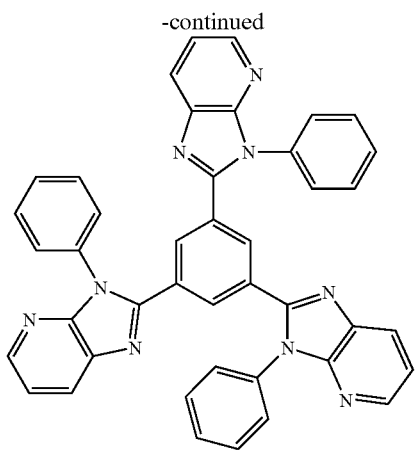
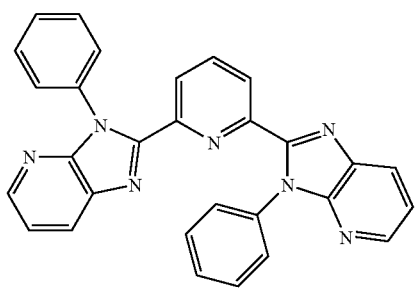
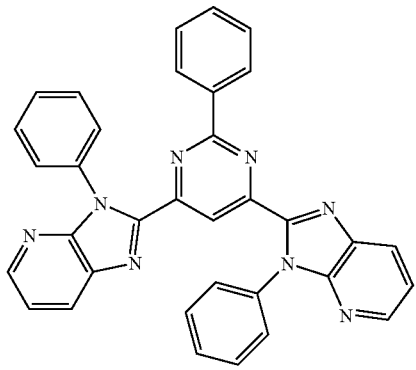
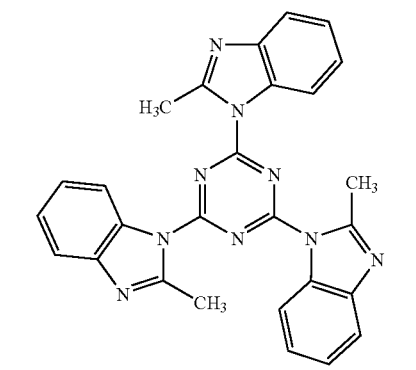
-continued
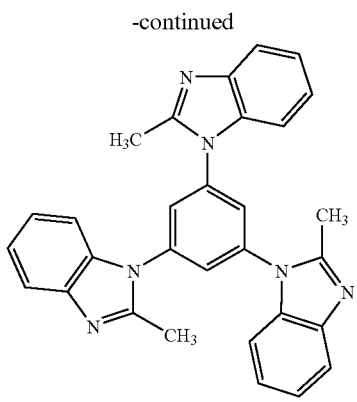
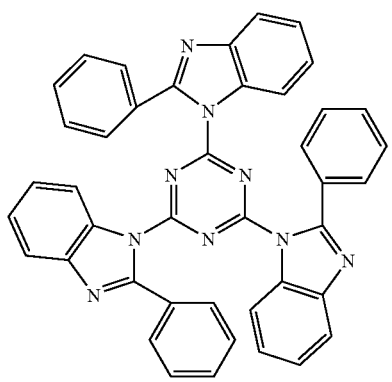
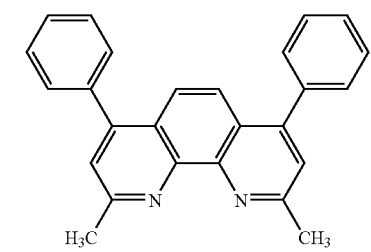
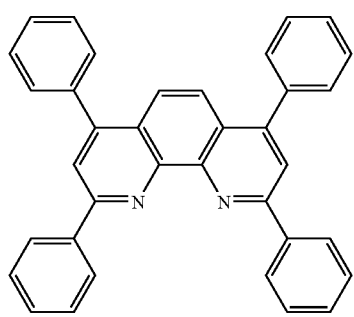

-continued
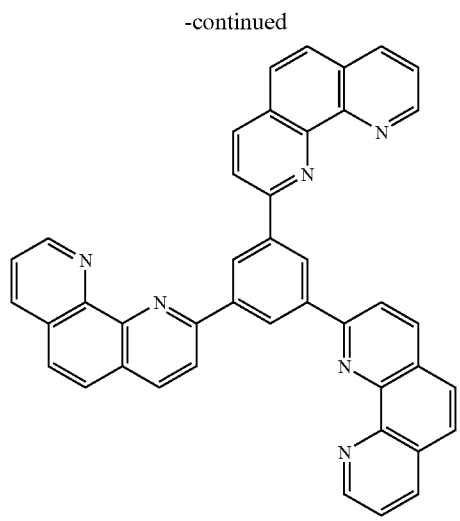
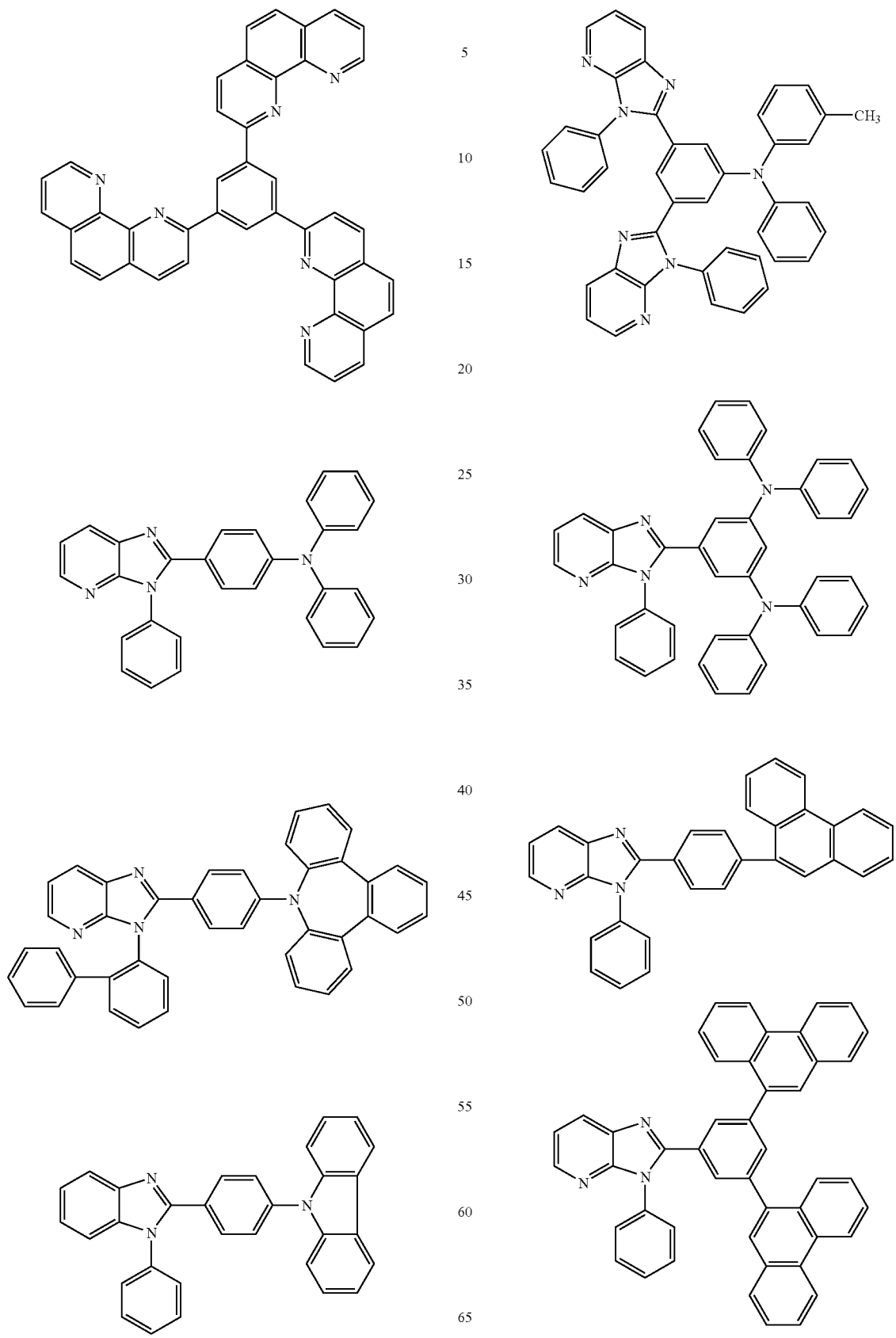

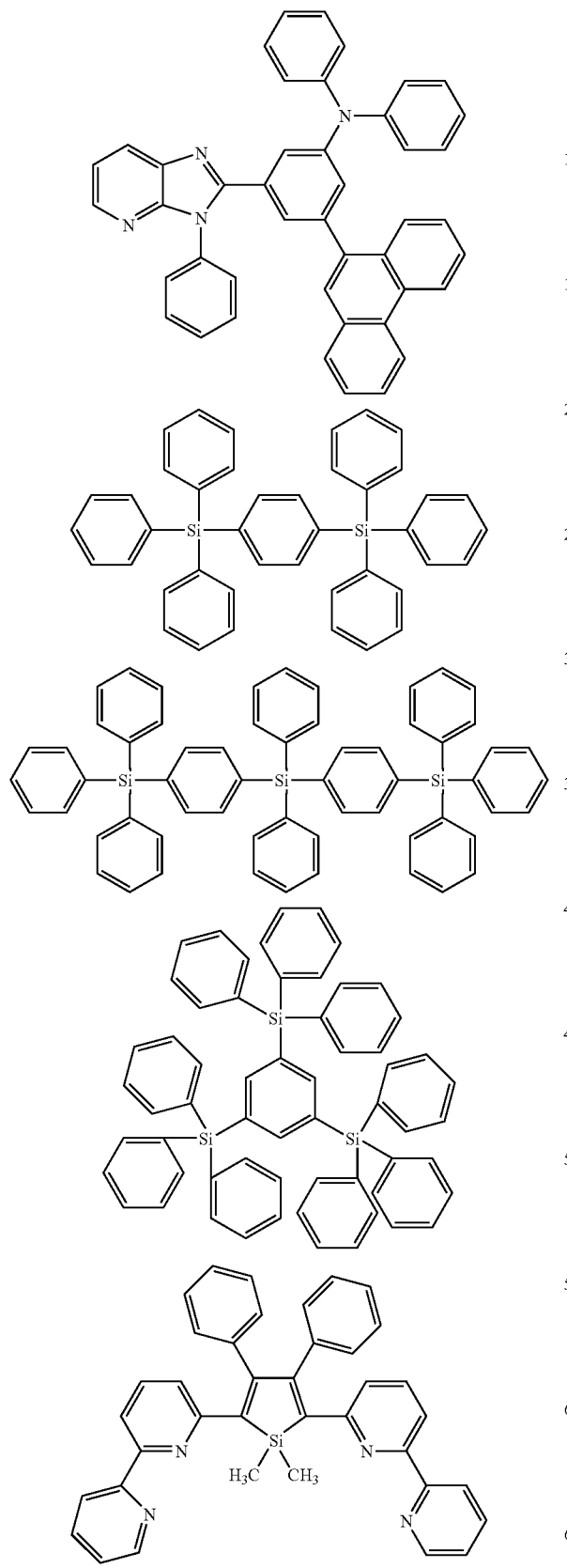
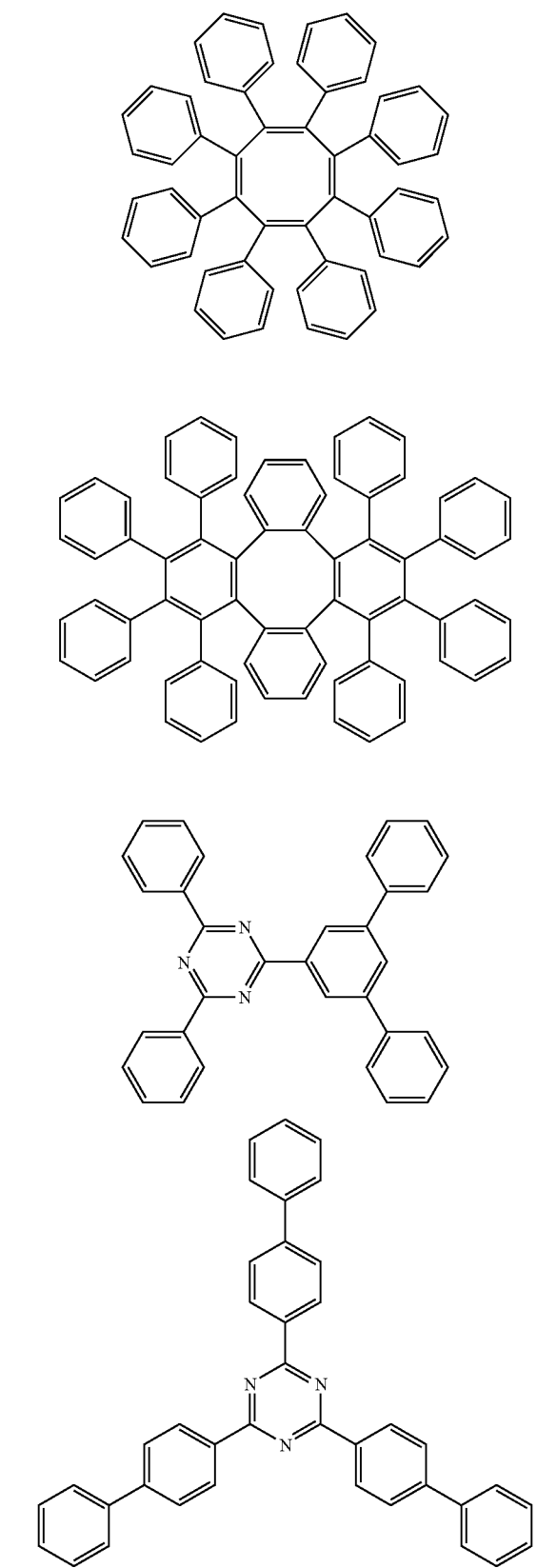

-continued
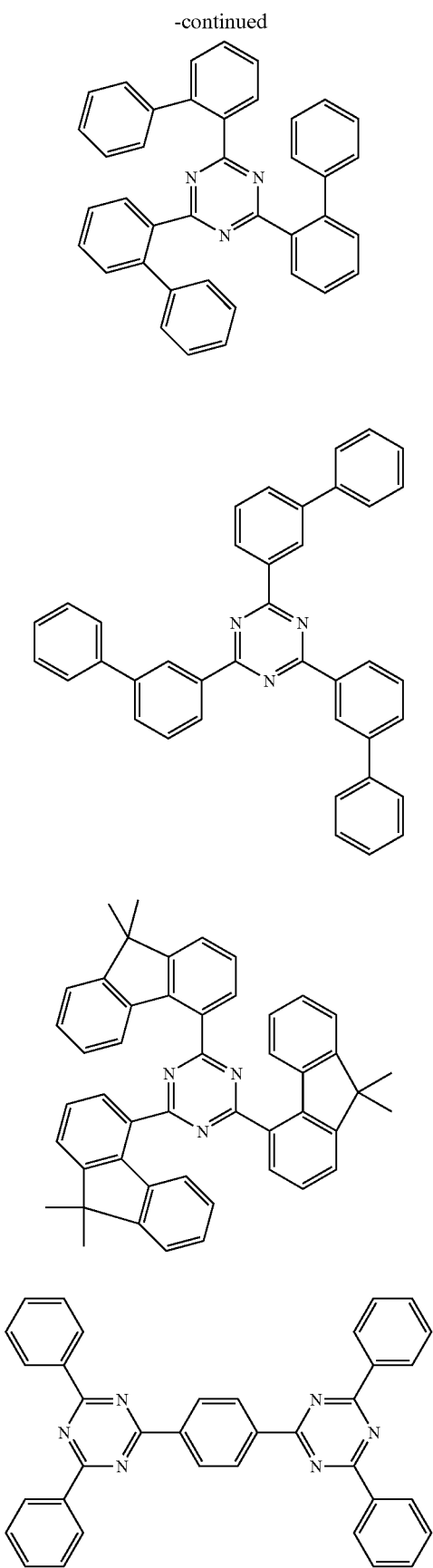
-continued
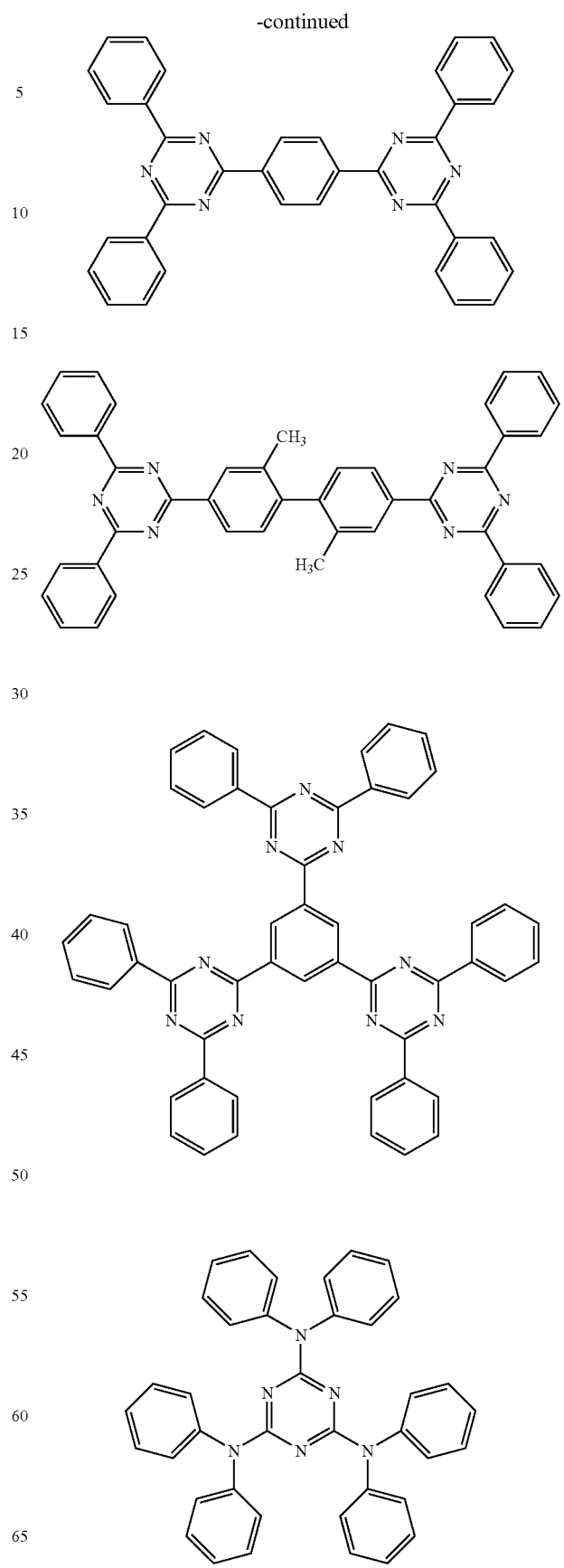

-continued
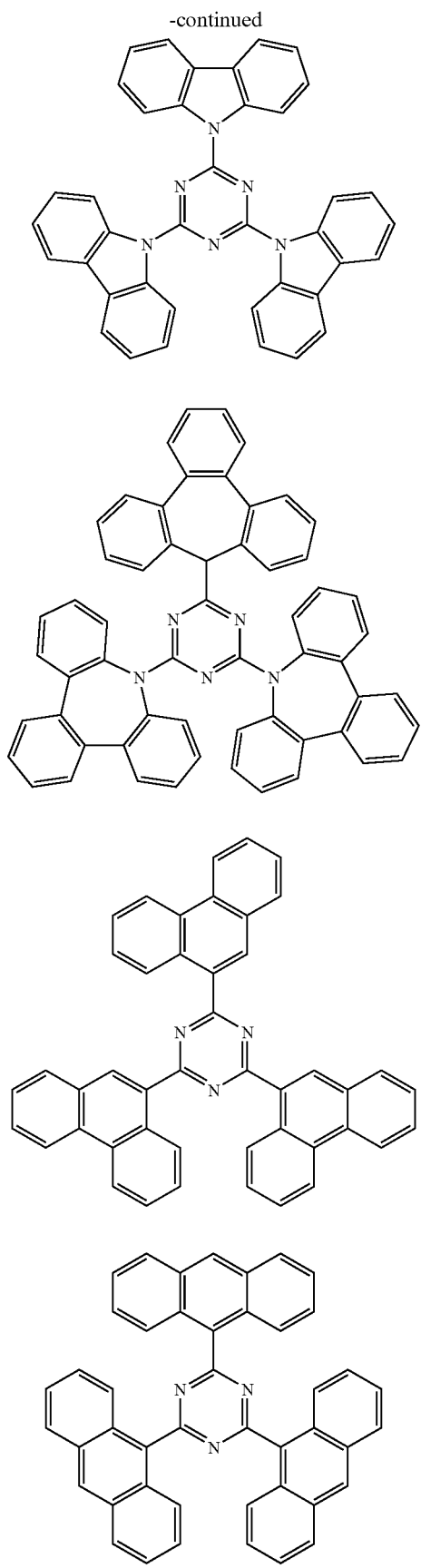
-continued
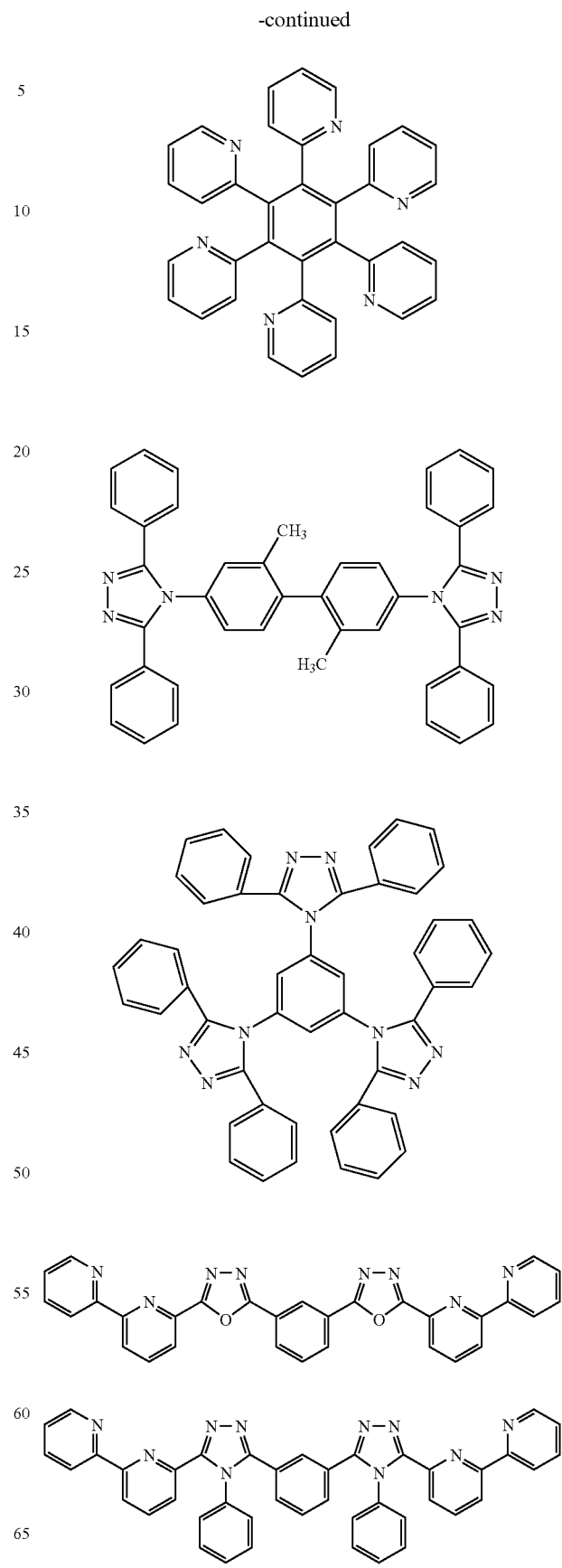

-continued
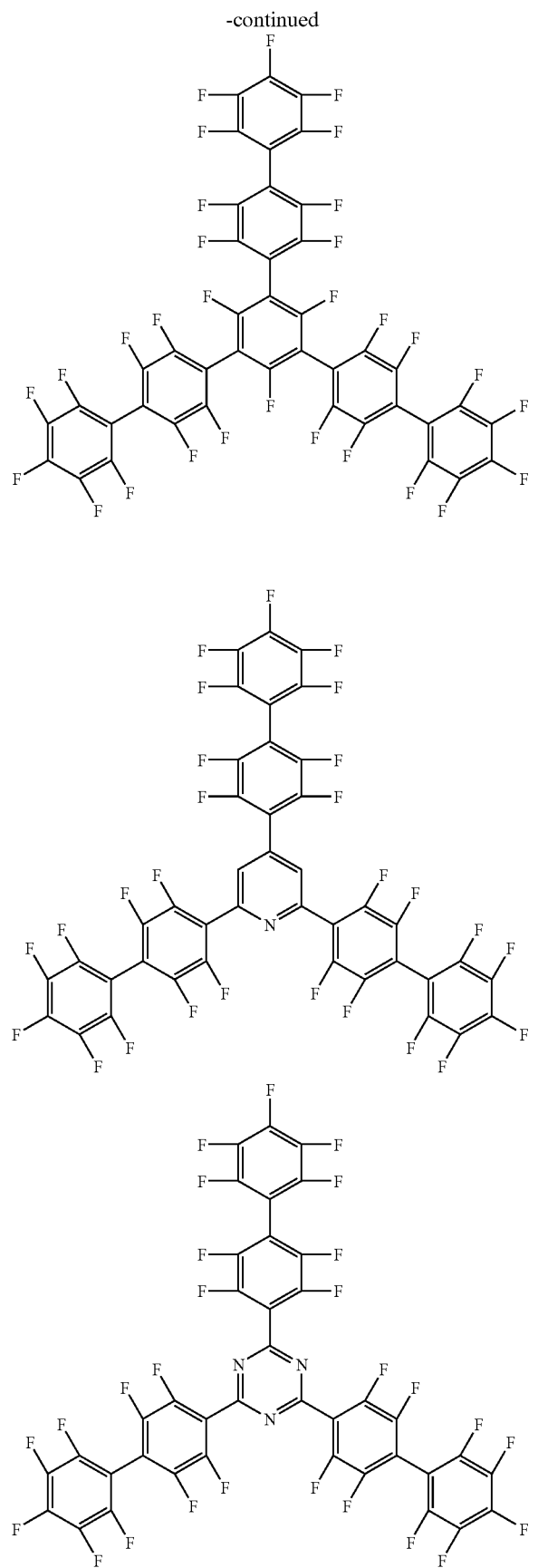
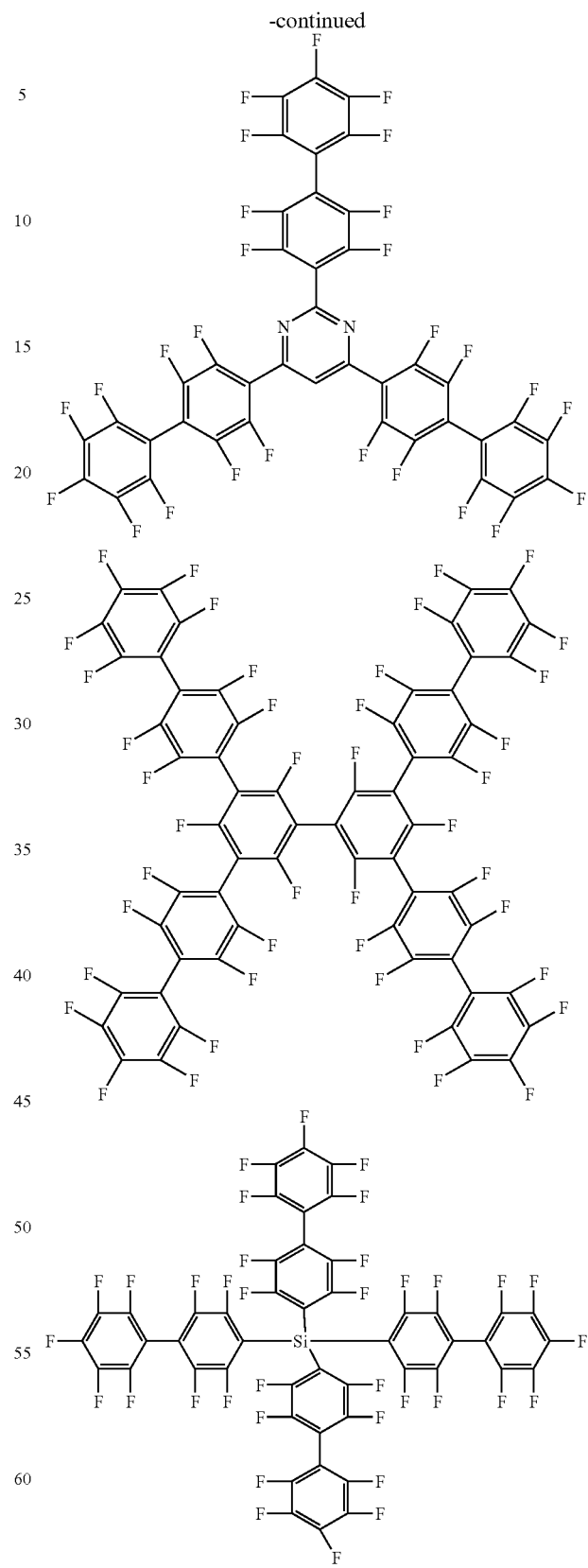
The hole transport material to be used in the adjacent layer of the invention is not particularly limited as long as the electron affinity Ea (HT) of the hole transport material satisfies the relation of 1 eV≦Ea (ET)−Ea (HT)≦2.8 eV, and any preferred material may be used.
The following compounds are preferably used as the hole transport material, but the invention is not limited to them alone.
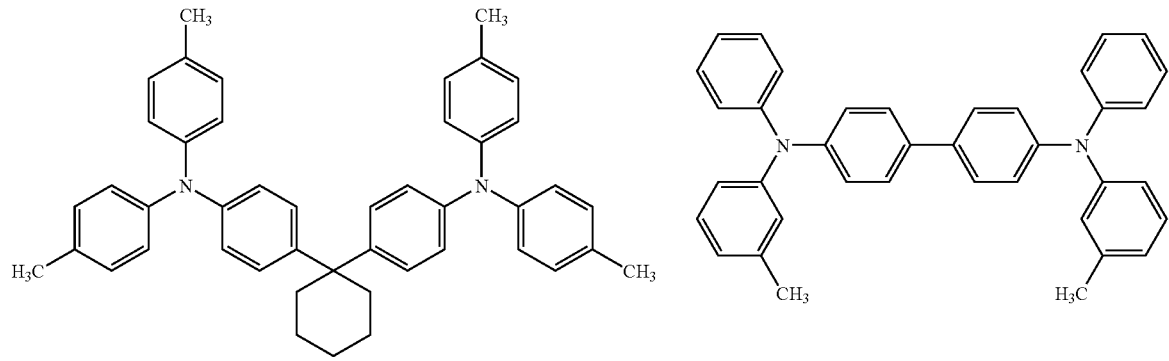
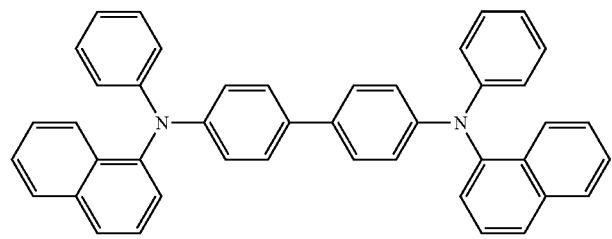
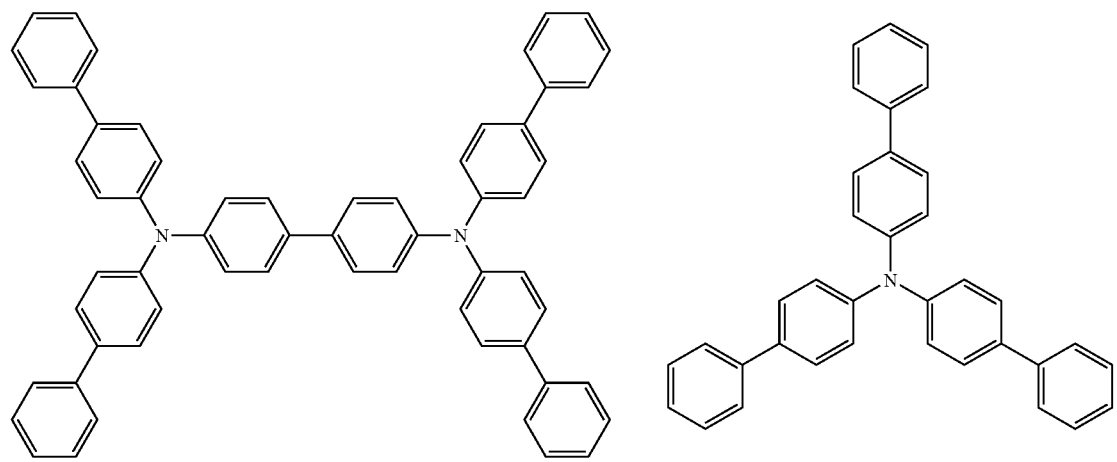

-continued
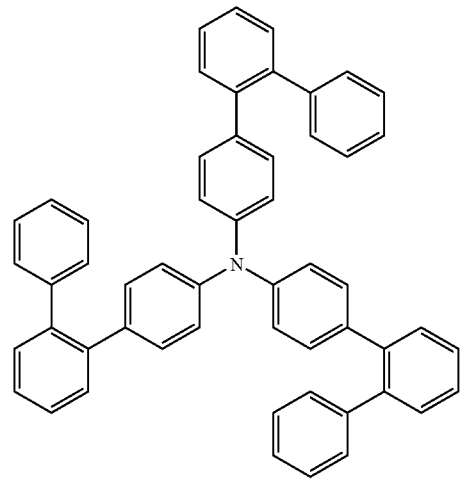
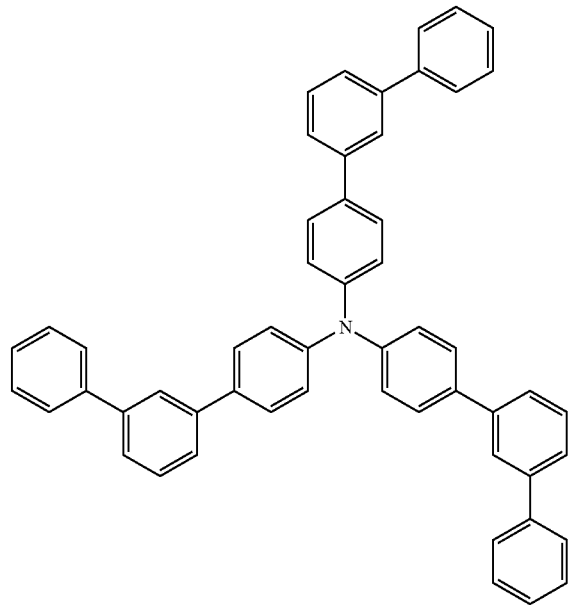
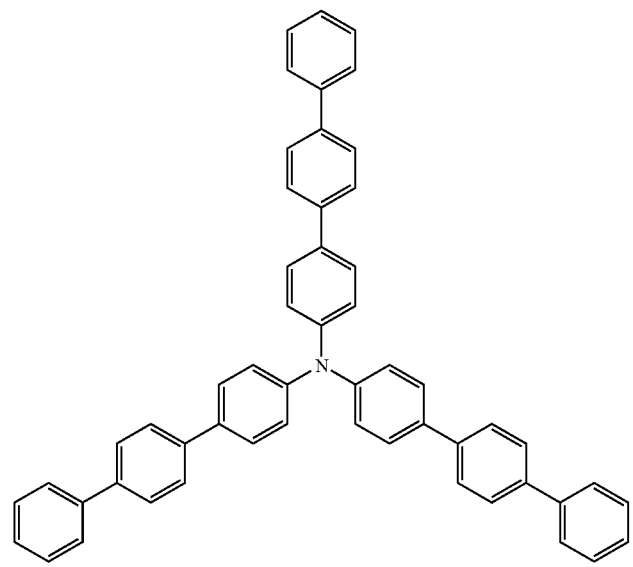
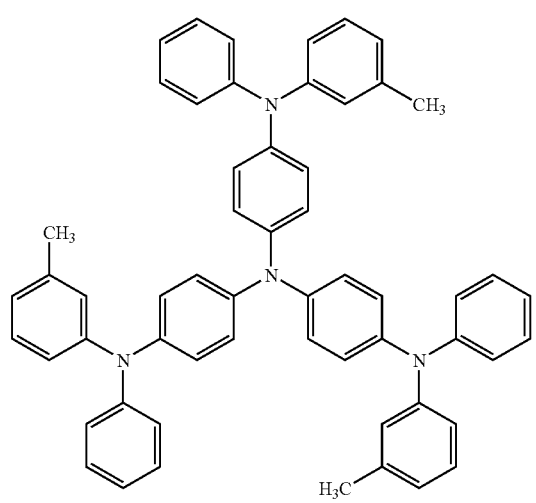

-continued
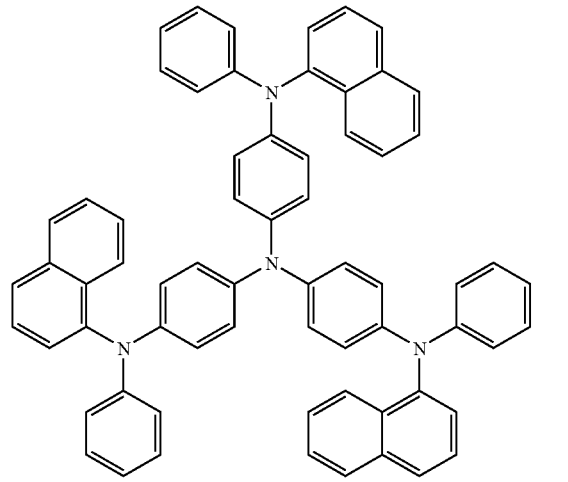
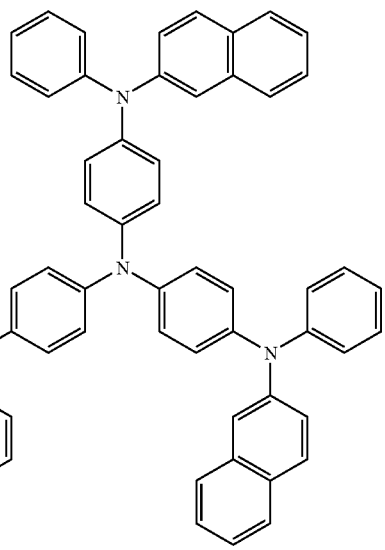
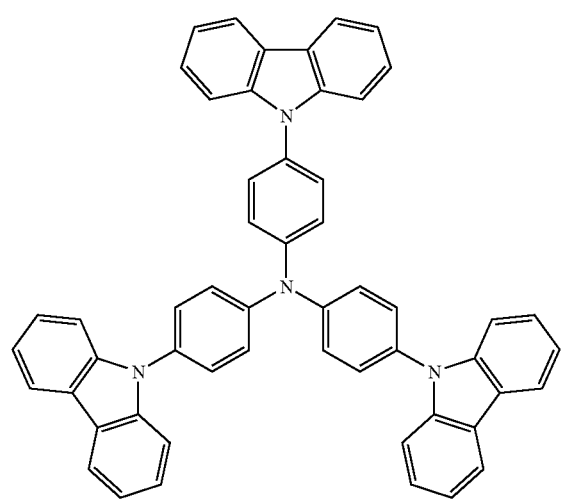
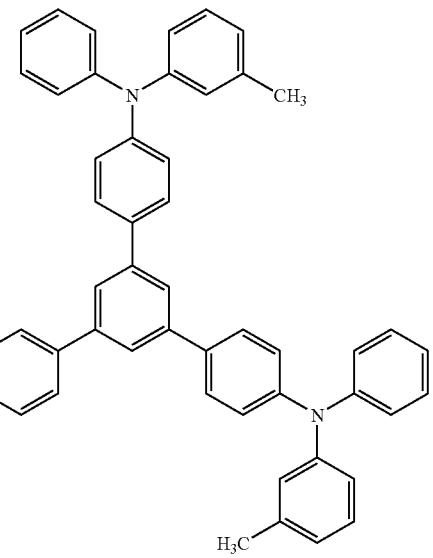
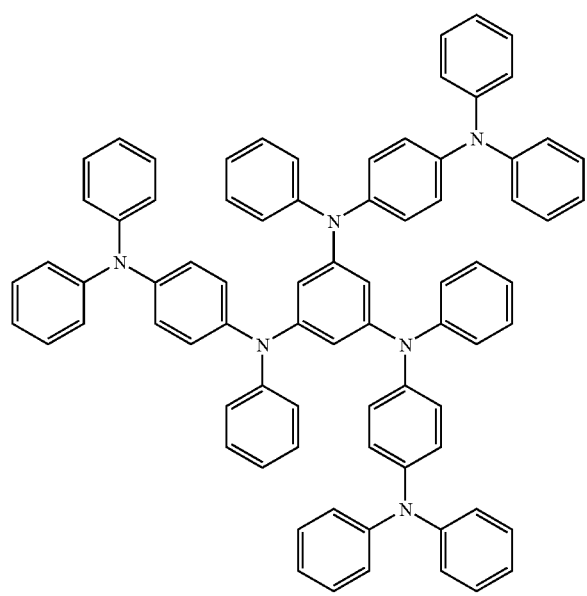

-continued
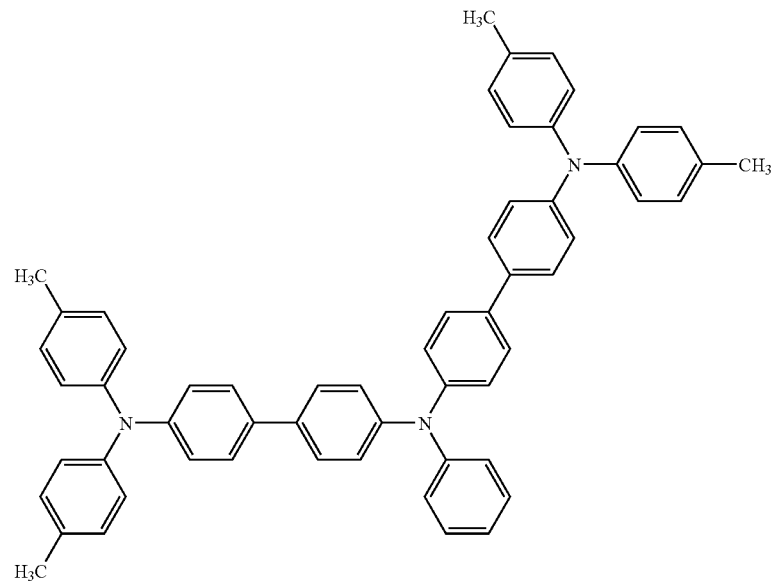
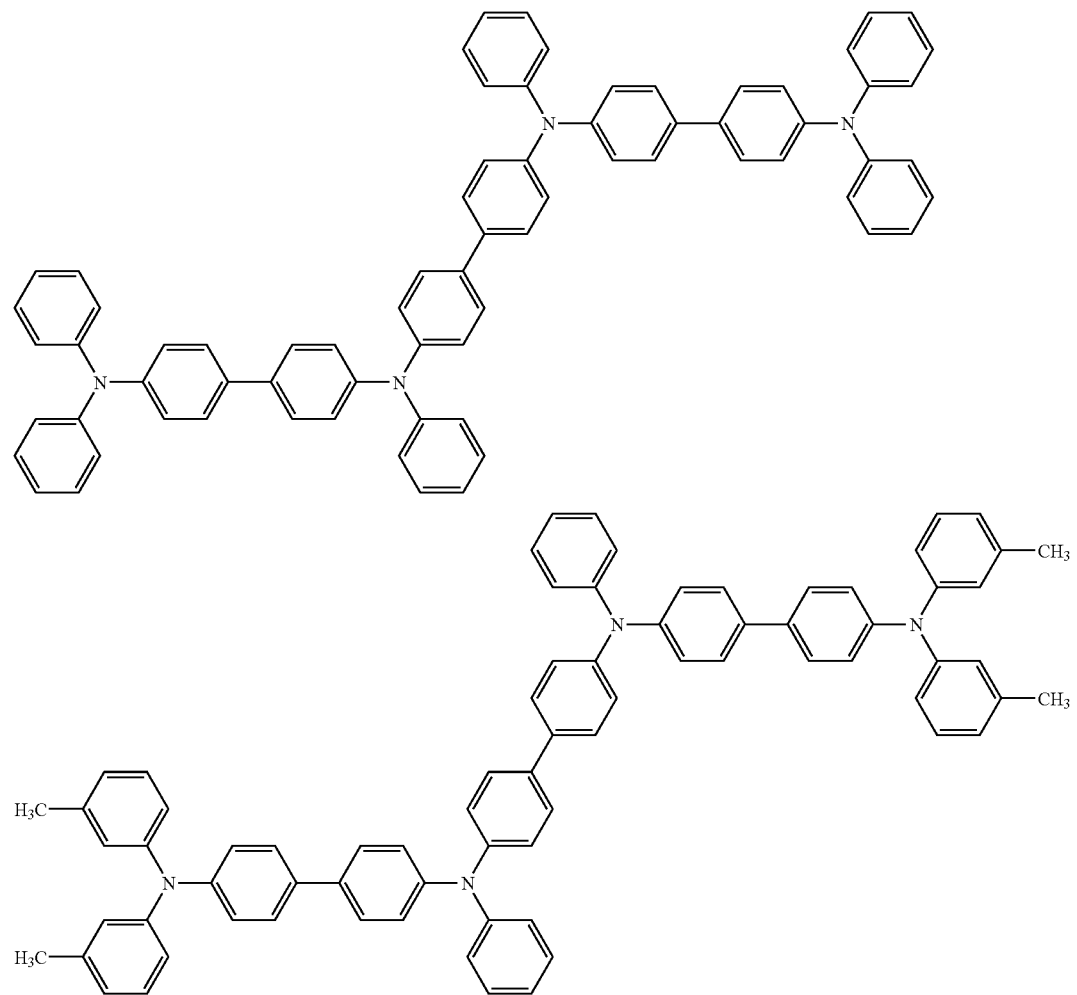

-continued
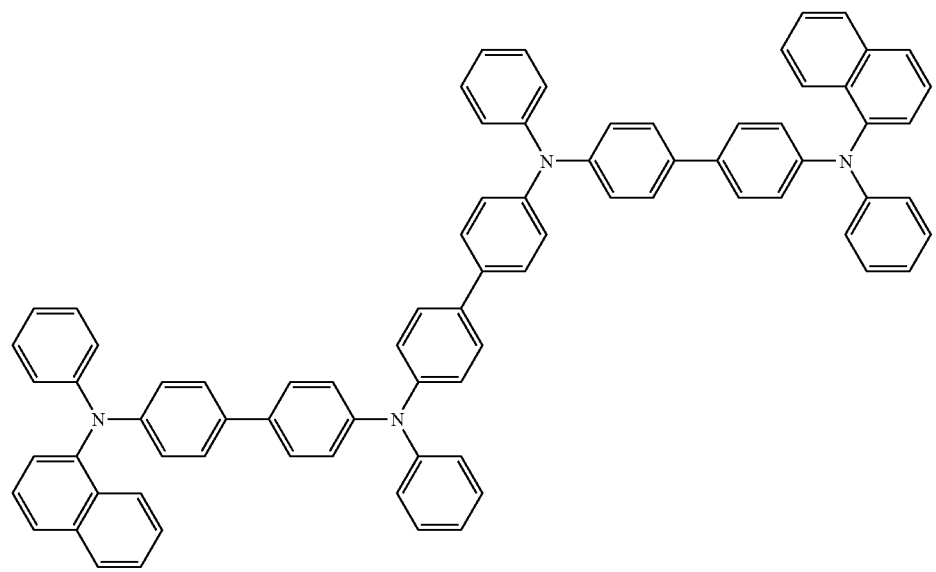
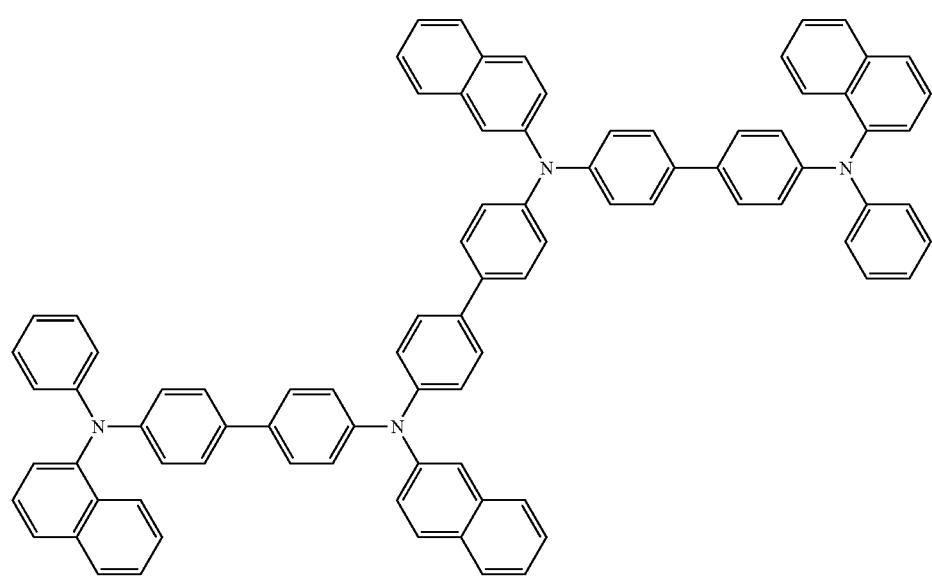

-continued
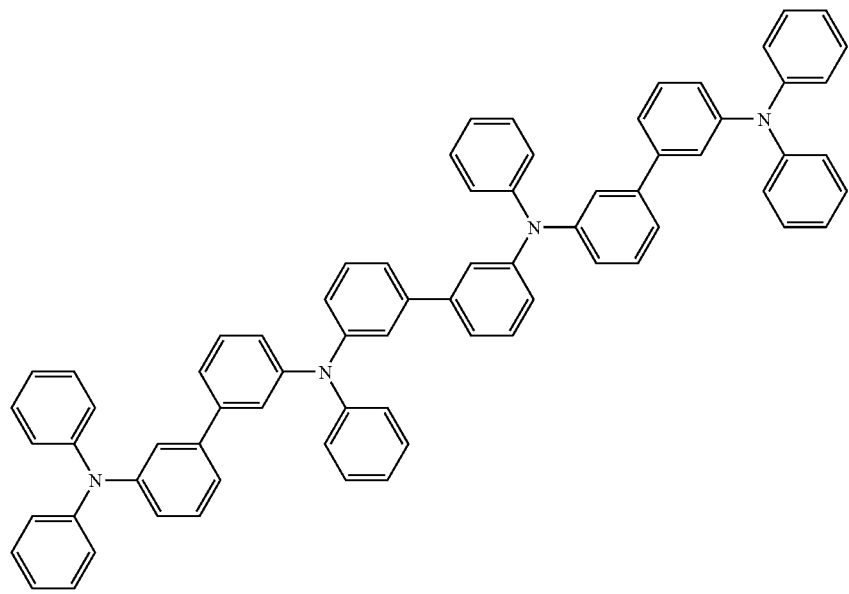
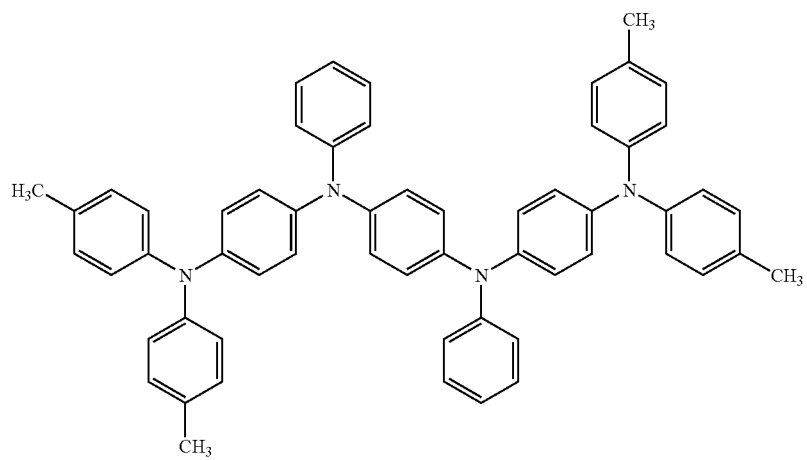
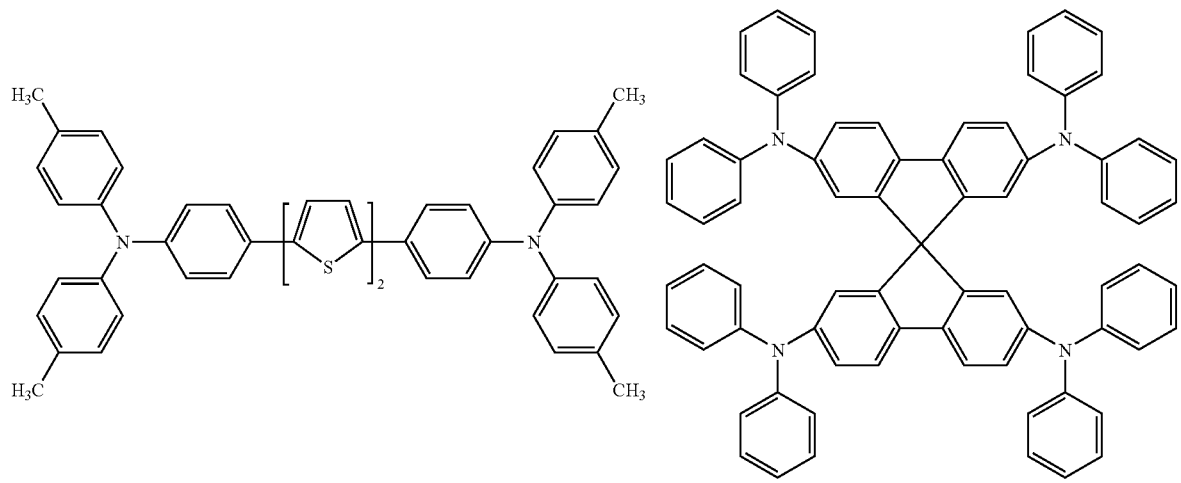

-continued
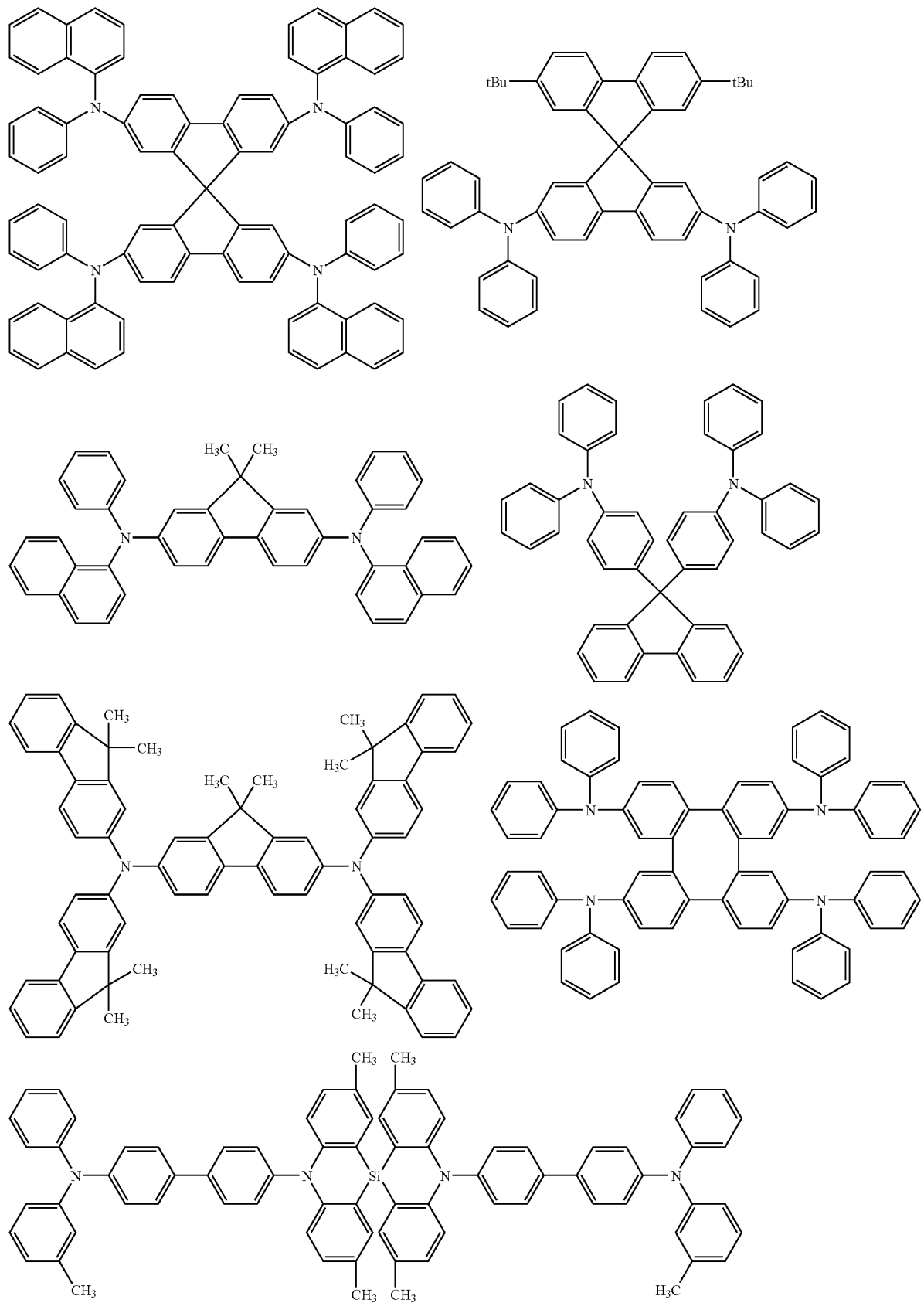

-continued
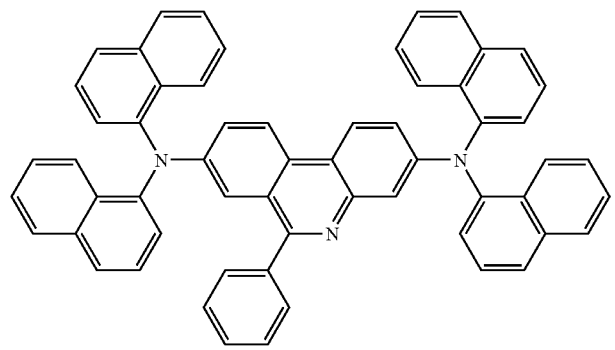
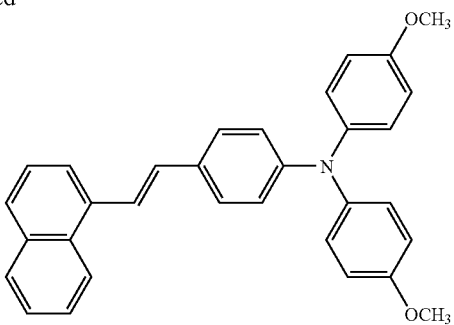
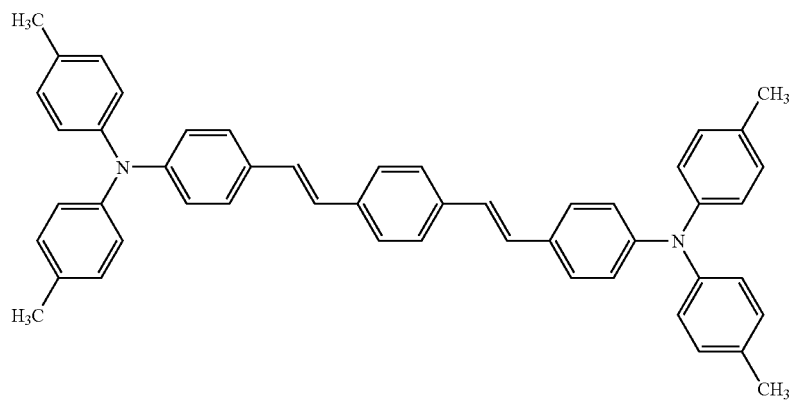
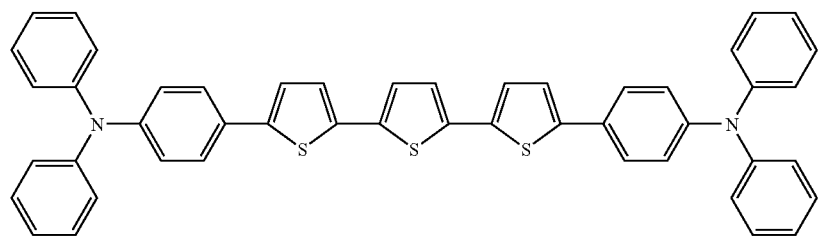
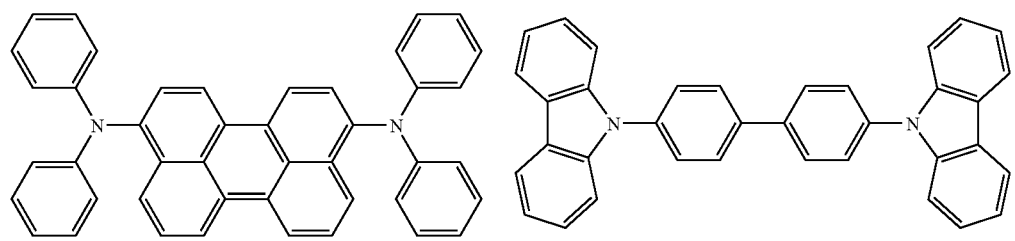
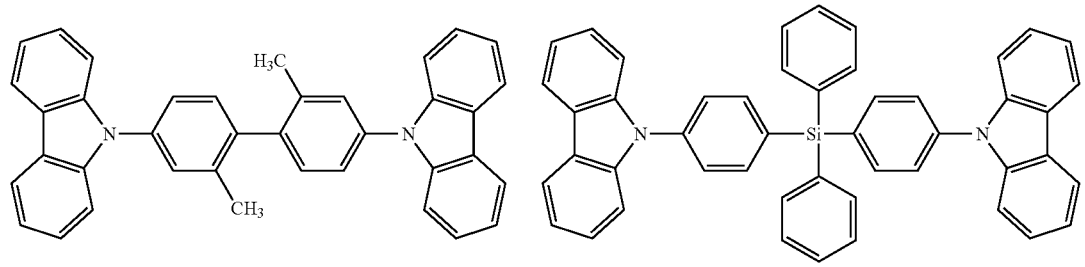

-continued
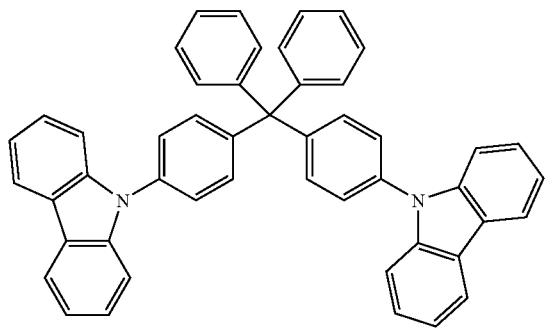
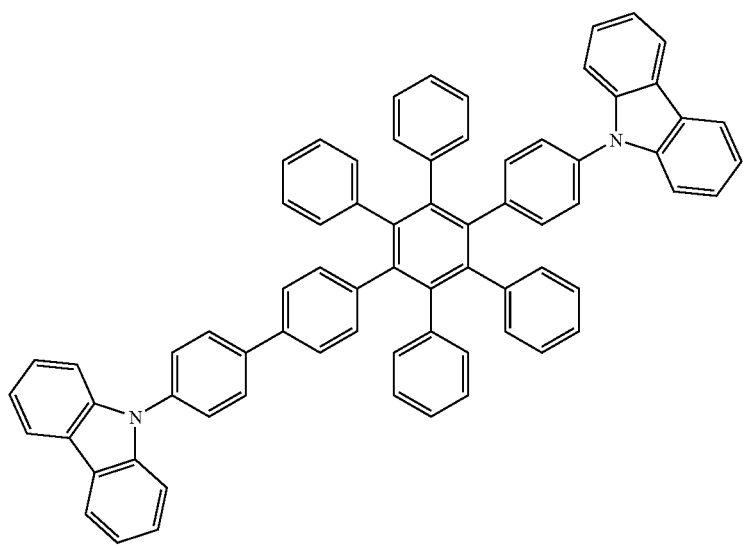
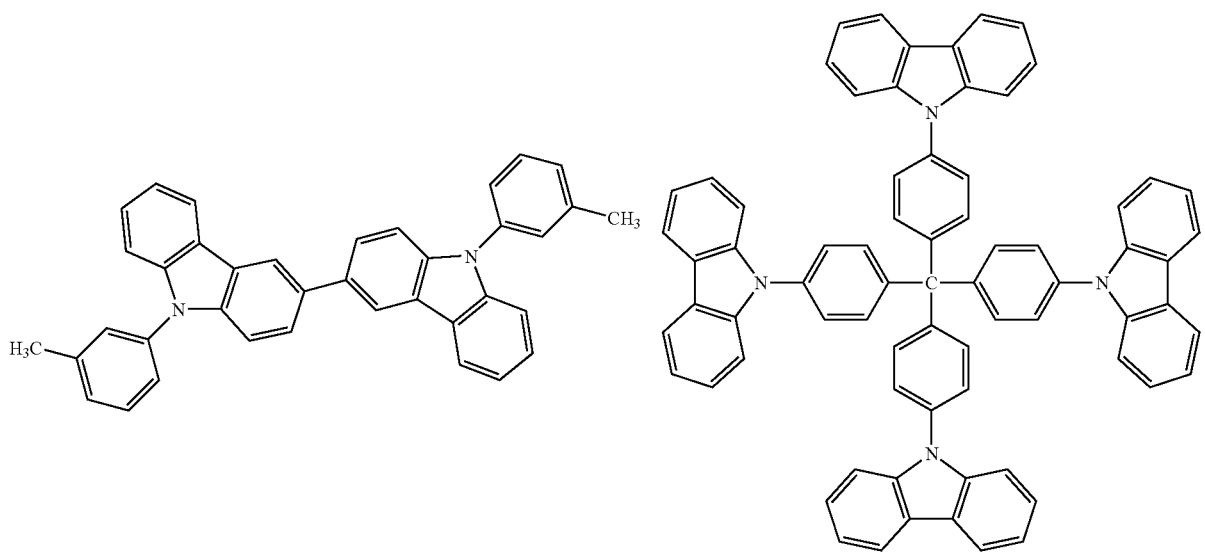

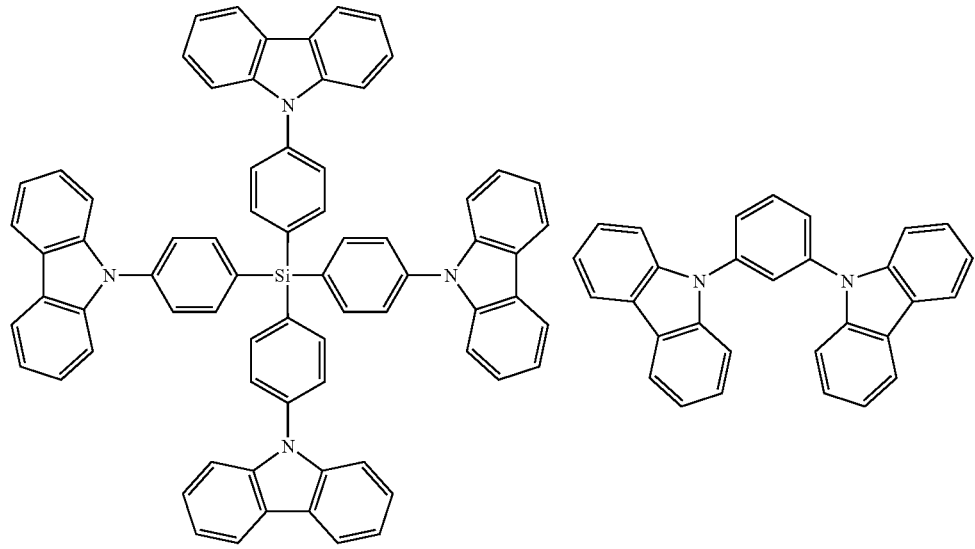
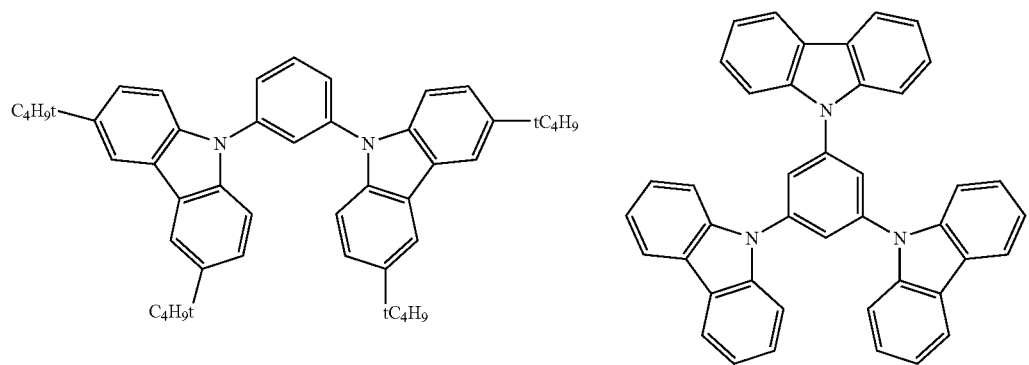
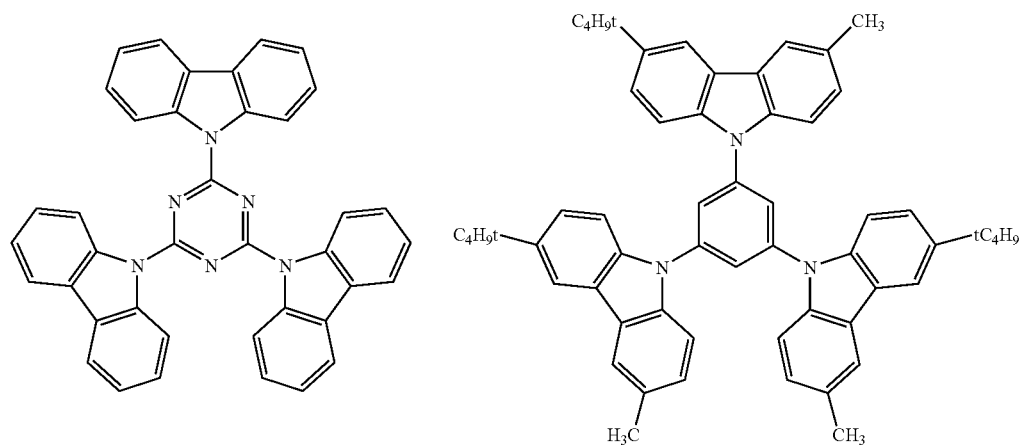

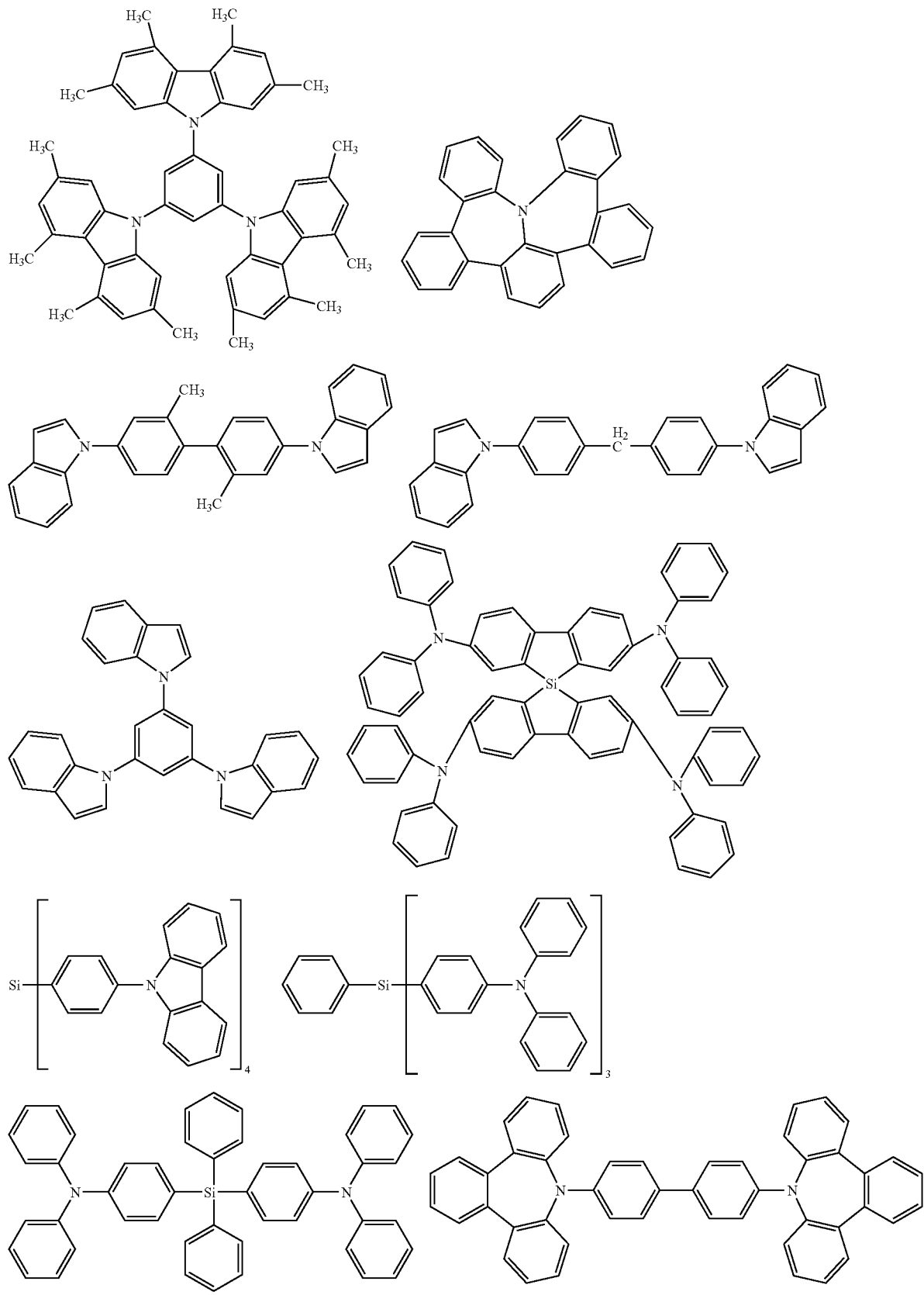

-continued
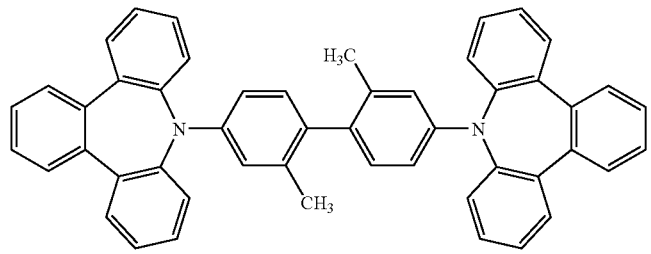
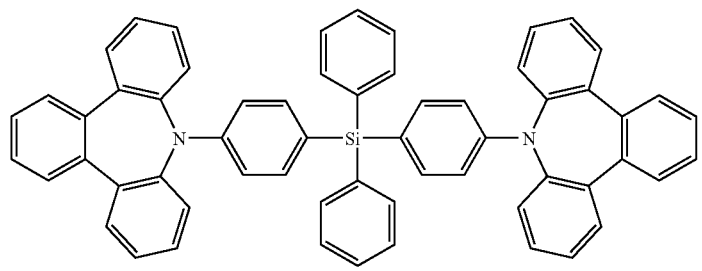
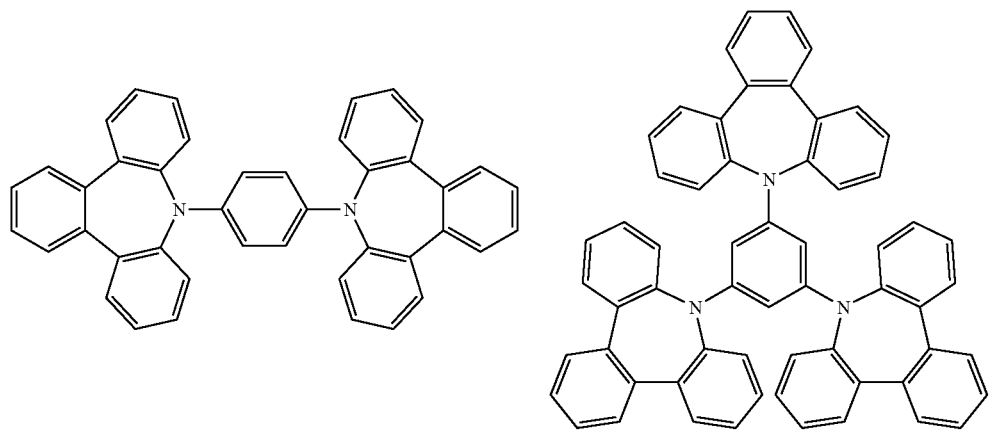
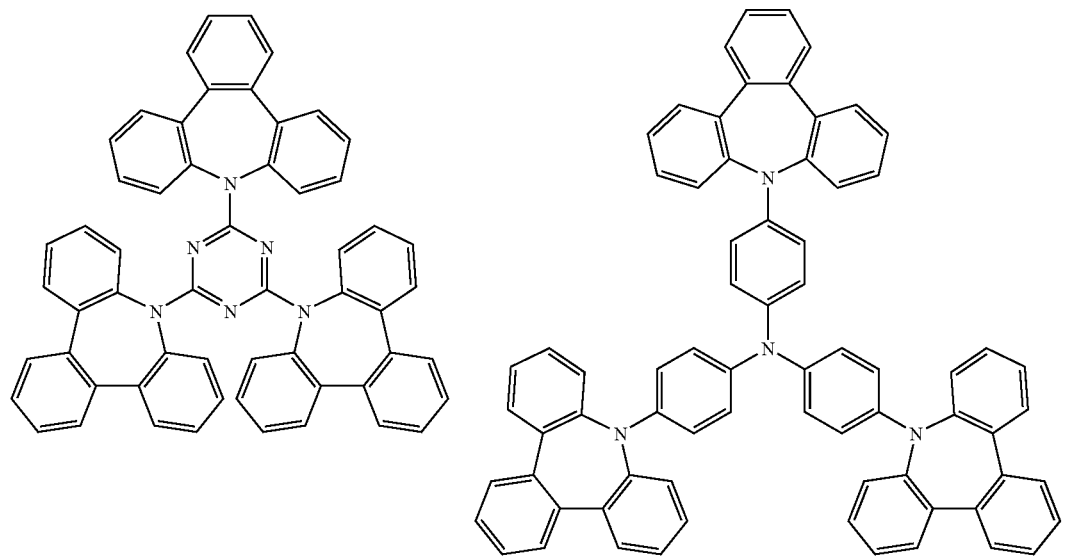

-continued

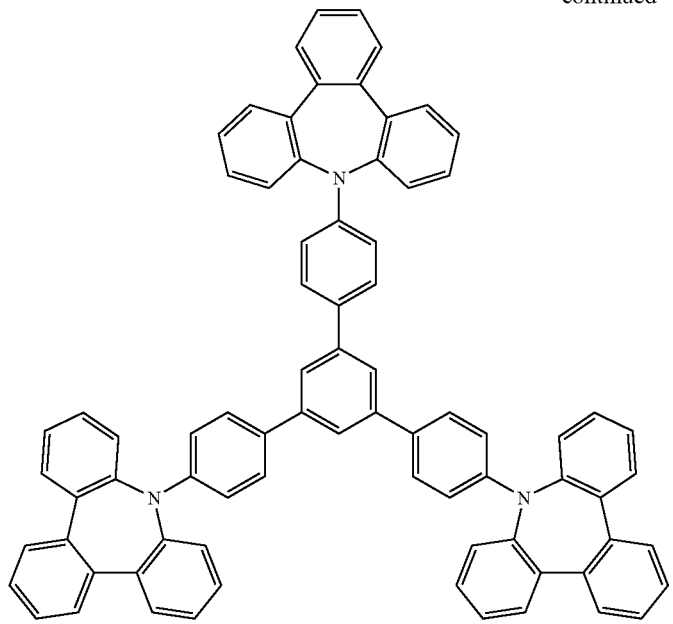

The electron transport material and hole transport material used in the adjacent layer of the invention may be used either alone or in combination of plural types.

The concentration of the electron transport material used in the adjacent layer of the invention is preferably 10 to 95% by mass in the total solid content of the adjacent layer, more preferably 20 to 80% by mass, and most preferably 30 to 70% by mass, because element durability may be lowered if the concentration is too high, and electrons may not be injected effectively into the luminescent layer and the luminescent efficiency may be lowered if the concentration is too low.

The concentration of the hole transport material used in the adjacent layer of the invention is preferably 5 to 90% by mass in the total solid content of the adjacent layer, more preferably 20 to 80% by mass, and most preferably 30 to 70% by mass, because carrier balance is broken and luminescent efficiency is lowered if the concentration is too high, and durability improving effect is not obtained sufficiently if the concentration is too low.

The thickness of the adjacent layer is not particularly limited, and is preferably 1 nm to 12 nm, more preferably 1 nm to 8 nm, and most preferably 2 nm to 5 nm, from the viewpoint of enhancement of durability.

The electron mobility of the electron transport material used in the adjacent layer of the invention is preferably $1 \times 10^{-4}$ to $10$ cm$^2$/Vs from the viewpoint of sufficient electron injection into the luminescent layer.

The electron mobility of the electron transport material can be determined by TOF (time of flight) method, and the electron mobility in the invention is the value determined by TOF method.

—Hole Injecting Layer and Hole Transport Layer—

The hole injecting layer and the hole transport layer are layers having the function of accepting holes from the anode or the anode side and transporting them to the cathode side. Specifically, the hole injecting layer and the hole transport layer are preferably layers containing carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidene type compounds, porphyrin type compounds, organic silane derivatives, carbon or the like. The thicknesses of the hole injecting layer and the hole transport layer are each preferably 50 nm or less, from the viewpoint of lowering the driving voltage.

The thickness of the hole transport layer is preferably from 5 to 50 nm, and more preferably from 10 to 40 nm. Also, the thickness of the hole injecting layer is preferably from 0.5 to 50 nm, and more preferably from 1 to 40 nm.

The hole injecting layer and the hole transport layer may be of single-layered structure comprising one, or two or more types of the aforementioned materials, or may be of a multi-layered structure consisting of a plurality of layers having the same composition or different compositions.

The hole-injecting layer or the hole transport layer in the organic EL element of the invention can contain an electron accepting dopant. The electron accepting dopant contained in the hole-injecting layer or the hole transport layer may be an inorganic compound or an organic compound as long as the dopant has an electron acceptability and is capable of oxidizing an organic compound.

Preferred examples of the inorganic compound dopant include Lewis acid compounds such as ferric chloride, aluminum chloride, gallium chloride, indium chloride, and antimony pentachloride. Preferred examples of the organic compound dopant include an organic compound having a substituent such as nitro group, halogen group, cyano group, and trifluoromethyl group, quinone compound, acid anhydride compound, and fullerene.

These electron accepting dopants may be used alone or in combination of two or more kinds thereof. The content of the electron accepting dopant, which varies depending on the type of the material, is preferably 0.01 to 50% by mass, more preferably 0.05 to 20% by mass, and particularly preferably 0.1 to 10% by mass based on the mass of the materials contained in the hole transport layer.

—Electron Injecting Layer and Electron Transport Layer—

The electron injecting layer and the electron transport layer are layers having the function of accepting electrons from the cathode or the cathode side and transporting them to the anode side. Specifically, the electron injecting layer and the electron transport layer are preferably layers containing triazole derivatives, oxazole derivatives, oxadiazole derivatives, imidazole derivatives, fluorenone derivatives, anthraquinodimethane derivatives, anthrone derivatives, diphenylquinone derivatives, thiopyran dioxide derivatives, carbodiimide derivatives, fluorenylidenemethane derivatives, distyrylpyrazine derivatives, aromatic ring (such as naphthalene and perylene) tetracarboxylic acid anhydrides, phthalocyanine derivatives, various metal complexes such as metal complexes of 8-quinolinol derivatives, metallophthalocyanines, and metal complexes having benzoxazole or benzothiazole as a ligand, organic silane derivatives or the like.

The thicknesses of the electron injecting layer and the electron transport layer are each preferably 50 nm or less from the viewpoint of lowering the driving voltage.

The thickness of the electron transport layer is preferably from 5 to 50 nm, and more preferably from 10 to 50 nm. Also, the thickness of the electron injecting layer is preferably from 0.1 to 50 nm, and more preferably from 0.5 to 20 nm.

The electron injecting layer and the electron transport layer may be of a single-layered structure comprising one or two or more types of the aforementioned materials, or may be of a multilayered structure consisting of a plurality of layers having the same composition or different compositions.

The electron-injecting layer or the electron transport layer in the organic EL element of the invention can contain an electron donating dopant. The electron donating dopant contained in the electron-injecting layer or the electron transport layer is not limited as long as the dopant has an electron donating ability and is capable of reducing an organic compound. Preferred examples of the electron donating dopant include alkali metals such as Li, alkaline earth metals such as Mg, transition metals such as rare earth metals, and reducing organic compounds.

Metals having a work function of 4.2 eV or less are particularly preferably used as the metal dopant, and examples thereof include Li, Na, K, Be, Mg, Ca, Sr, Ba, Y, Cs, La, Sm, Gd, and Yb. Examples of the reducing organic compounds include nitrogen-containing compounds, sulfur-containing compounds, and phosphorous-containing compounds.

These electron donating dopants may be used alone or in combination of two or more kinds thereof. The content of the electron donating dopant, which varies depending on the type of the material, is preferably 0.1 to 99% by mass, more preferably 1.0 to 80% by mass, and particularly preferably 2.0 to 70% by mass based on the mass of the materials contained in the electron transport layer.

<Protective Layer>

In the invention, the organic EL element as a whole may be protected by a protective layer.

The materials contained in the protective layer preferably have a function of preventing the factors which promote element deterioration such as moisture or oxygen from entering into the element.

Specific examples thereof include metals such as In, Sn, Pb, Au, Cu, Ag, Al, Ti, Ni or the like; metal oxides such as MgO, SiO, $SiO_2$, $Al_2O_3$, GeO, NiO, CaO, BaO, $Fe_2O_3$, $Y_2O_3$, $TiO_2$ or the like; metal nitrides such as $SiN_x$, and $SiN_xO_y$; metal fluorides such as $MgF_2$, LiF, $AlF_3$, and $CaF_2$; polyethylene, polypropylene, polymethyl methacrylate, polyimide, polyurea, polytetrafluoroethylene, polychlorotrifluoroethylene, polydichlorodifluoroethylene, copolymers of chlorotrifluoroethylene and dichlorodifluoroethylene, copolymers obtainable by copolymerization of a monomer mixture including tetrafluoroethylene and at least one comonomer, fluorine-containing copolymers having a cyclic structure in the copolymer main chain, absorbent materials having an absorption rate of 1% or more, and moisture-resistant materials having an absorption rate of 0.1% or less.

The method for formation of the protective layer is not particularly limited, and for example, vacuum deposition method, sputtering, reactive sputtering method, MBE method (molecular beam epitaxy), cluster ion beam method, ion plating method, plasma polymerization method (high frequency-excited ion plating), plasma CVD method, laser CVD method, thermal CVD method, gas source CVD method, coating method, printing method, and transcription method.

<Sealing>

Moreover, the organic electroluminescent element of the invention may be sealed for the entire element using a sealing vessel.

Also, the space between the sealing vessel and the luminescent element may be sealed with a moisture absorbent or an inactive liquid. The moisture absorbent, though not particularly limited, may be exemplified by barium oxide, sodium oxide, potassium oxide, calcium oxide, sodium sulfate, calcium sulfate, magnesium sulfate, phosphorous pentoxide, calcium chloride, magnesium chloride, copper chloride, cesium fluoride, niobium fluoride, calcium bromide, vanadium bromide, molecular sieves, zeolites, magnesium oxide or the like. The inactive liquid, though not particularly limited, may be exemplified by paraffins, liquid paraffins, fluorine type solvents such as perfluoroalkanes, perfluoroamines or perfluoroethers, chlorine type solvents, and silicone oils.

In the organic electroluminescent element of the invention, light emission can be achieved by applying a direct current (it may include an alternating current component, if desired) voltage (typically 2 volts to 15 volts) or a DC current between the anode and the cathode.

As for the method of driving the organic electroluminescent element of the invention, the methods described in the publications of JP-A Nos. 2-148687, 6-301355, 5-29080, 7-134558, 8-234685 and 8-241047, in the specifications of Japanese Patent No. 2784615, U.S. Pat. Nos. 5,828,429 and 6,023,308, and the like can be applied.

The organic EL element of the invention is preferably applied in display element, display device, backlight, electrophotography, illuminating light source, recording light source, exposure light source, reading light source, marker, signboard, interior decorating, optical communications, etc.

EXAMPLES

The present invention is more specifically described below by showing examples, but the invention is not limited to these examples alone.

Comparative Example 1

On a glass substrate of 0.5 mm in thickness and 2.5 cm square, using ITO target of $In_2O_3$ content of 95% by mass, an ITO thin film (thickness 0.2 μm) was formed as a transparent anode by DC magnetron sputtering (condition: base material temperature 100° C., oxygen pressure $1\times10^{-3}$ Pa). Surface resistance of the ITO thin film was 10Ω/□.

The substrate with the transparent anode was put in a cleaning container, cleaned in IPA, and treated by UV ozone for 30 minutes. On this transparent anode, a hole injecting layer of 10 nm was disposed by using copper phthalocyanine (CuPC) at a speed of 0.5 nm/sec by vacuum deposition method.

Further thereon, a hole transport layer of 30 nm was disposed by using α-NPD ((N,N'-di-α-naphthyl-N,N'-diphenyl)-benzidine) at a speed of 0.5 nm/sec by vacuum deposition method.

Moreover thereon, CBP as a host material in the luminescent layer, and Ir(ppy)$_3$ as a phosphorescent material in the luminescent layer, were codeposited at a rate of 100/5 by vacuum deposition method to form a luminescent layer of 30 nm.

On the luminescent layer, the following compound (a) was deposited at a speed of 0.5 nm/sec by vacuum deposition method to form an adjacent layer of 10 nm, and further thereon Alq$_3$ as an electron transport material was deposited at a speed of 0.2 nm/sec by vacuum deposition method to form an electron injecting layer of 40 nm. (Ionization potential of the single layer of the compound (a) was measured by UPS method, and found to be 7.1 eV.)

On this layer, moreover, a patterned mask (mask with a luminescent area of 2 mm×2 mm) was placed, and lithium fluoride was deposited by 1 nm by vacuum deposition method. Aluminum was further deposited thereon by vacuum deposition method to form a cathode of 0.1 μm.

The obtained luminescent laminated product was put in a glove box replaced by nitrogen gas, and was sealed by using a stainless steel sealing can containing desiccant and an adhesive of ultraviolet curing type (XNR5516HV, manufactured by Nagase Ciba) to obtain a luminescent element of comparative example 1.

Operation from the deposition of copper phthalocyanine to the sealing was conducted in vacuum or nitrogen atmosphere, and the element was produced without being exposed to atmosphere.

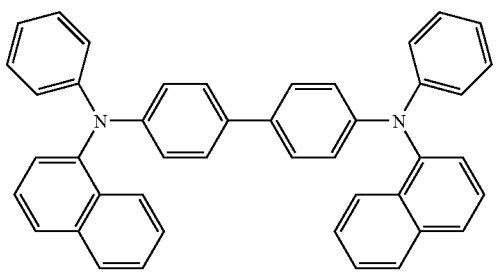

α-NPD

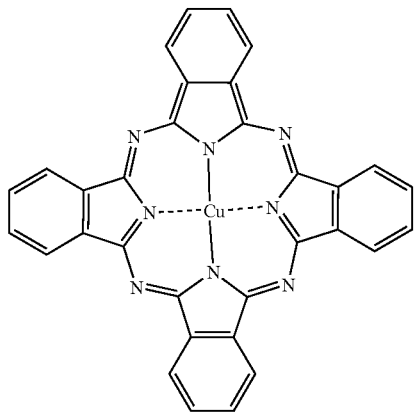

CuPC

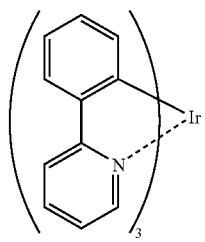

Ir(ppy)$_3$

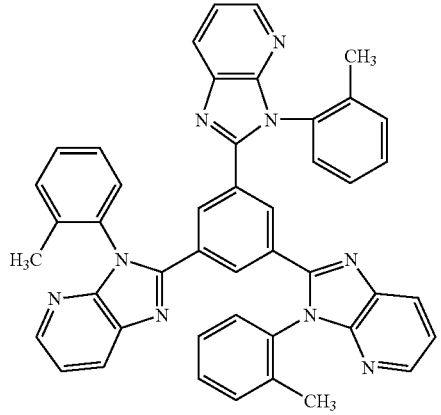

Compound (a)

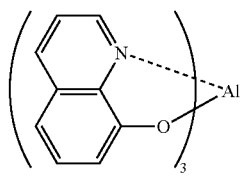

Alq$_3$

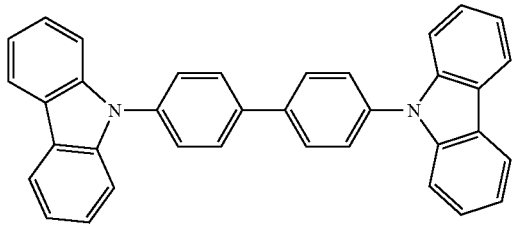

CBP

[Evaluation]

The ionization potential (Ip), electron affinity (Ea), and electron mobility in the electron transport material and hole transport material of the adjacent layer used in the above were measured in the following methods by using a single film (single layer) of each material. Results are shown in Table 1.

—Ionization Potential (Ip)—

Materials of which ionization potential (Ip) is 6.2 eV or less were measured by an ultraviolet photoelectron analyzing apparatus AC-1 (manufactured by Riken Keiki), and those exceeding 6.2 eV were measured by UPS method.

—Electron Affinity (Ea)—

Band gap was calculated from absorption spectrum of the single layer, and electron affinity (Ea) was calculated from this value and the above value of the ionization potential (Ip).

Using the obtained luminescent element, driving durability was measured in the following method.

—Driving Durability Test—

The luminescent element was continuously driven at a current density of 20 mA/cm$^2$ until the luminance was reduced to half, and the luminance half period T(½) was obtained.

Example 1

A luminescent element was manufactured by the same procedure as in comparative example 1, except that the adjacent layer of 10 nm was formed by codepositing compound (a) as an electron transport material and α-NPD as a hole transport material at a rate of 5/4 by vacuum deposition method, instead of the adjacent layer of the electron transport material compound (a) in comparative example 1, and was evaluated similarly. Ea and Ip of the electron transport material and hole transport material were measured by the same methods as in comparative example 1. Results are shown in Table 1.

Example 2

A luminescent element was manufactured by the same procedure as in example 1, except that the following compound (b) was used as a hole transport material, instead of the hole transport material α-NPD of the adjacent layer in example 1, and was evaluated similarly. Ea and Ip of the electron transport material and hole transport material were measured by the same methods as in comparative example 1. Results are shown in Table 1.

Compound (b)

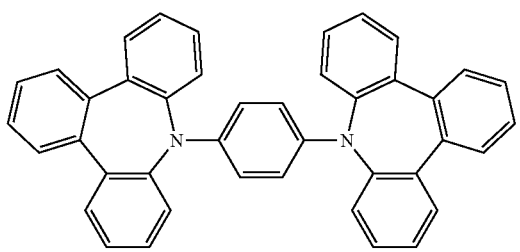

Example 3

A luminescent element was manufactured by the same procedure as in example 1, except that 4,4',4"-tris (2-methylphenyl phenyl amino) triphenyl amine (m-MTDATA) was used as a hole transport material, instead of the hole transport material α-NPD of the adjacent layer in example 1, and was evaluated similarly. Ea and Ip of the electron transport material and hole transport material were measured by the same methods as in comparative example 1. Results are shown in Table 1.

Example 4

A luminescent element was manufactured by the same procedure as in example 3, except that the adjacent layer was formed by codepositing the electron transport material compound (a) and hole transport material m-MTDATA at a rate of 4:5, and was evaluated similarly. Ea and Ip of the electron transport material and hole transport material were measured by the same methods as in comparative example 1. Results are shown in Table 1.

Example 5

A luminescent element was manufactured by the same procedure as in example 3, except that the adjacent layer was formed by codepositing the electron transport material compound (a) and hole transport material m-MTDATA at a rate of 2:5, and was evaluated similarly. Ea and Ip of the electron transport material and hole transport material were measured by the same methods as in comparative example 1. Results are shown in Table 1.

Example 6

A luminescent element was manufactured by the same procedure as in example 3, except that the adjacent layer was formed by codepositing the electron transport material compound (a) and hole transport material m-MTDATA at a rate of 5:1, and was evaluated similarly. Ea and Ip of the electron transport material and hole transport material were measured by the same methods as in comparative example 1. Results are shown in Table 1.

Example 7

A luminescent element was manufactured by the same procedure as in example 3, except that the adjacent layer of 3 nm in film thickness was formed by codepositing the electron transport material compound (a) and hole transport material m-MTDATA at a rate of 5:2, and that thereon an electron injecting layer was formed by depositing 7 nm of compound (a) as an electron transport material and further 40 nm of Alq$_3$ as an electron transport material, and was evaluated similarly. Ea and Ip of the electron transport material and hole transport material were measured by the same methods as in comparative example 1. Results are shown in Table 1.

TABLE 1

| | | Comparative Example 1 | Example 1 | Example 2 | Example 3 | Example 4 | Example 5 | Example 6 | Example 7 |
|---|---|---|---|---|---|---|---|---|---|
| Hole-injecting/transport layer | | CuPc/NPD | CuPc/NPD | CuPc/NPD | CuPc/NPD | CuPc/NPD | CuPc/NPD | CuPc/NPD | CuPc/NPD |
| Luminescent layer | Host | CBP | CBP | CBP | CBP | CBP | CBP | CBP | CBP |
| | Phosphorescent material | Ir(ppy)$_3$ | Ir(ppy)$_3$ | Ir(ppy)$_3$ | Ir(ppy)$_3$ | Ir(ppy)$_3$ | Ir(ppy)$_3$ | Ir(ppy)$_3$ | Ir(ppy)$_3$ |

TABLE 1-continued

| | | Comparative Example 1 | Example 1 | Example 2 | Example 3 | Example 4 | Example 5 | Example 6 | Example 7 |
|---|---|---|---|---|---|---|---|---|---|
| Adjacent layer | Electron transport material | Compound a | Compound a | Compound a | Compound a | Compound a | Compound a | Compound a | Compound a |
| | Hole transport material | — | α-NPD | Compound b | m-MTDATA | m-MTDATA | m-MTDATA | m-MTDATA | m-MTDATA |
| Ratio of electron transport material and hole transport material in adjacent layer | | — | 5:4 | 5:4 | 5:4 | 4:5 | 2:5 | 5:1 | 5:2 |
| Thickness of adjacent layer (nm) | | 10 | 10 | 10 | 10 | 10 | 10 | 10 | 3 |
| Electron mobility of electron transport material of adjacent layer ($cm^2/Vs$) | | $9 \times 10^{-4}$ | $9 \times 10^{-4}$ | $9 \times 10^{-4}$ | $9 \times 10^{-4}$ | $9 \times 10^{-4}$ | $9 \times 10^{-4}$ | $9 \times 10^{-4}$ | $9 \times 10^{-4}$ |
| Ea (ET): Ea of electron transport material of adjacent layer (eV) | | 3.6 | 3.6 | 3.6 | 3.6 | 3.6 | 3.6 | 3.6 | 3.6 |
| Ea (HT): Ea of hole transport material of adjacent layer (eV) | | — | 2.4 | 1.9 | 1.9 | 1.9 | 1.9 | 1.9 | 1.9 |
| Ea (ET)-Ea (HT) | | — | 1.2 | 1.7 | 1.7 | 1.7 | 1.7 | 1.7 | 1.7 |
| Ip (ET): Ip of electron transport material of adjacent layer (eV) | | 7.1 | 7.1 | 7.1 | 7.1 | 7.1 | 7.1 | 7.1 | 7.1 |
| Ip (HT): Ip of hole transport material of adjacent layer (eV) | | — | 5.4 | 4.9 | 5.1 | 5.1 | 5.1 | 5.1 | 5.1 |
| Ip (ET)-Ip (HT) | | — | 1.7 | 2.2 | 2.0 | 2.0 | 2.0 | 2.0 | 2.0 |
| Durability @ 20 $mA/cm^2$ Initial luminance in driving test ($cd/m^2$) | | 4700 | 4700 | 4700 | 5100 | 5000 | 5200 | 4900 | 4900 |
| Luminance half-period (hours) | | 80 | 300 | 170 | 200 | 300 | 260 | 170 | 150 |
| Luminous efficiency (cd/A) @ 20 $mA/cm^2$ | | 24 | 24 | 24 | 26 | 25 | 26 | 25 | 25 |

As clear from Table 1, the invention can enhance the element driving durability without lowering the luminous efficiency.

As described above, the invention provides an organic electroluminescent element improved in driving durability without lowering the luminescence property.

What is claimed is:

1. An organic electroluminescent element comprising, between an anode and a cathode, at least a luminescent layer and an adjacent layer that is adjacent to the cathode side of the luminescent layer, wherein said adjacent layer is formed directly on the luminescent layer, and
    wherein the luminescent layer contains a phosphorescent material and a host material, the adjacent layer contains an electron transport material and a hole transport material, said luminescent layer does not contain said electron transport material and said hole transport material, the thickness of the adjacent layer is 1 nm to 12 nm, and the electron affinity Ea (HT) of the hole transport material and the electron affinity Ea (ET) of the electron transport material satisfy the relation of 1 eV≦Ea (ET)–Ea (HT) ≦2.8 eV.

2. The organic electroluminescent element of claim 1, wherein the electron affinity Ea (HT) of the hole transport material and the electron affinity Ea (ET) of the electron transport material satisfy the relation of 1.2 eV≦Ea (ET)–Ea (HT)≦2.8 eV.

3. The organic electroluminescent element of claim 1, wherein the ionization potential Ip (HT) of the hole transport material and the ionization potential Ip (ET) of the electron transport material satisfy the relation of 1 eV≦Ip (ET)–Ip (HT)≦2.8 eV.

4. The organic electroluminescent element of claim 1, wherein the electron mobility of the electron transport material is $1 \times 10^{-4}$ to 10 $cm^2/Vs$.

5. The organic electroluminescent element of claim 1, wherein the concentration of the hole transport material contained in the adjacent layer is 5% by mass to 90% by mass based on the total solid content of the adjacent layer.

6. The organic electroluminescent element of claim 1, wherein the concentration of the hole transport material contained in the adjacent layer is 20% by mass to 80% by mass based on the total solid content of the adjacent layer.

7. The organic electroluminescent element of claim 1, wherein the hole transport material is an aryl amine compound.

8. The organic electroluminescent element of claim 1, wherein the electron transport material is a compound selected from the group consisting of an azole compound, an azine compound, an organic silane compound, and a fluorine-substituted aromatic hydrocarbon ring compound.

9. The organic electroluminescent element of claim 1, wherein the electron transport material is an azole compound or an azine compound.

10. The organic electroluminescent element of claim 1, wherein the electron transport material is a compound represented by formula (A-1) or (B-1):

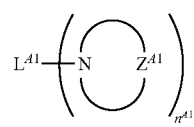

Formula (A-1)

wherein $Z^{A1}$ represents an atomic group necessary for forming a nitrogen-containing heterocycle, $L^{A1}$ is a linking group, and $n^{A1}$ is an integer of 2 or more;

Formula (B-1)

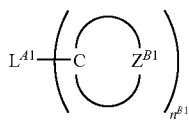

wherein $Z^{B1}$ represents an atomic group necessary for forming an aromatic hydrocarbon ring or an aromatic heterocycle, $L^{B1}$ is a linking group, and $n^{B1}$ is an integer of 2 or more.

11. The organic electroluminescent element of claim 10, wherein $L^{A1}$ and $L^{B1}$ are linking groups selected from the group consisting of a single bond, a carbon atom, a silicon atom, a boron atom, an oxygen atom, a sulfur atom, a germanium atom, an aromatic hydrocarbon ring, and an aromatic heterocycle.

12. The organic electroluminescent element of claim 10, wherein $L^{A1}$ and $L^{B1}$ are linking groups selected from the group consisting of a 1,3,5-benzene triyl group, a 1,2,5,6-benzene tetrayl group, a 1,2,3,4,5,6-benzene hexayl group, a 2,2'-dimethyl-4,4'-biphenylene group, a 2,4,6-pyridine triyl group, a 2,3,4,5,6-pyridine pentayl group, a 2,4,6-pyrimidine triyl group, a 2,4,6-triazine triyl group, and a 2,3,4,5-thiophene tetrayl group.

13. The organic electroluminescent element of claim 1, wherein the electron transport material contains three or more nitrogen atoms.

14. The organic electroluminescent element of claim 1, wherein the phosphorescent material is a complex containing a transition metal atom or a lanthanoid atom.

15. The organic electroluminescent element of claim 1, wherein the phosphorescent material is a complex containing at least one metal selected from the group consisting of ruthenium, rhodium, palladium, tungsten, rhenium, osmium, iridium, and platinum.

16. The organic electroluminescent element of claim 1, wherein the energy level of the lowest multiplet excited state of the host material is higher than the energy level of the lowest multiplet excited state of the phosphorescent material.

17. The organic electroluminescent element of claim 1, wherein the phosphorescent material is contained in an amount of 0.1 to 20% by mass in the luminescent layer.

18. The organic electroluminescent element of claim 1, wherein a hole injecting layer and a hole transport layer are further disposed between the anode and the luminescent layer, and a dielectric layer and an electron injecting layer are further disposed between the cathode and the luminescent layer.

19. The organic electroluminescent element of claim 1, wherein the phosphorescent material comprises $Ir(ppy)_3$.

* * * * *